(12) United States Patent
Ikeda

(10) Patent No.: US 11,195,088 B2
(45) Date of Patent: Dec. 7, 2021

(54) DATA PROCESSING DEVICE USING NEURAL NETWORK, ELECTRONIC COMPONENT, AND ELECTRONIC DEVICE

(71) Applicant: Semiconductor Energy Laboratory Co., Ltd., Atsugi (JP)

(72) Inventor: Takayuki Ikeda, Kanagawa (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 912 days.

(21) Appl. No.: 15/854,043

(22) Filed: Dec. 26, 2017

(65) Prior Publication Data

US 2018/0181862 A1 Jun. 28, 2018

(30) Foreign Application Priority Data

Dec. 28, 2016 (JP) .............................. JP2016-255409

(51) Int. Cl.
*G06N 3/063* (2006.01)
*H01L 23/528* (2006.01)
(Continued)

(52) U.S. Cl.
CPC ............. *G06N 3/0635* (2013.01); *G06N 3/04* (2013.01); *G06N 3/0454* (2013.01); *G06N 3/084* (2013.01);
(Continued)

(58) Field of Classification Search
CPC ........ G06N 3/063; G06N 3/0635; G06N 3/04; G06N 3/0454; G06N 3/084; H01L 21/8258
See application file for complete search history.

(56) References Cited

U.S. PATENT DOCUMENTS 5,047,655 A 9/1991 Chambost et al.
5,093,803 A 3/1992 Howard et al.
(Continued)

FOREIGN PATENT DOCUMENTS

JP 05-012466 A 1/1993
JP 06-187472 A 7/1994
(Continued)

OTHER PUBLICATIONS

Aslam-Siddiqi.A et al., "A 16×16 Nonvolatile Programmable Analog Vector-Matrix Multiplier", IEEE Journal of Solid-State Circuits, Oct. 1, 1998, vol. 33, No. 10, pp. 1502-1509.
(Continued)

*Primary Examiner* — Seahvosh Nikmanesh
(74) *Attorney, Agent, or Firm* — Fish & Richardson P.C.

(57) ABSTRACT

To provide a data processing device using a neural network that can suppress increase in the occupied area of a chip. A product-sum operation circuit is formed using a transistor including an oxide semiconductor having an extremely small off-state current. Signals are input to and output from the product-sum operation circuits included in a plurality of hidden layers through comparators. The outputs of the comparators are used as digital signals to be input signals for the next-stage hidden layer. The combination of a digital circuit and an analog circuit can eliminate the need for an analog-to-digital converter or a digital-to-analog converter which occupies a large area of a chip.

13 Claims, 15 Drawing Sheets

(51) Int. Cl.

| | | |
|---|---|---|
| *H01L 23/535* | (2006.01) | |
| *H01L 23/522* | (2006.01) | |
| *G06N 3/04* | (2006.01) | |
| *H01L 29/786* | (2006.01) | |
| *G06N 3/08* | (2006.01) | |
| *H01L 21/8258* | (2006.01) | |
| *H01L 27/088* | (2006.01) | |
| *H05K 1/18* | (2006.01) | |
| *H01L 27/06* | (2006.01) | |

(52) U.S. Cl.
CPC ........ *H01L 21/8258* (2013.01); *H01L 23/528* (2013.01); *H01L 23/5226* (2013.01); *H01L 23/535* (2013.01); *H01L 27/088* (2013.01); *H01L 29/7869* (2013.01); *H01L 29/78648* (2013.01); *H01L 29/78696* (2013.01); *H01L 27/0629* (2013.01); *H05K 1/181* (2013.01)

(56) References Cited

U.S. PATENT DOCUMENTS

| | | |
|---|---|---|
| 5,155,802 A | 10/1992 | Mueller et al. |
| 5,268,320 A | 12/1993 | Holler et al. |
| 6,452,237 B1 | 9/2002 | Varshavsky |
| 6,470,328 B1 | 10/2002 | Varshavsky |
| 8,547,753 B2 | 10/2013 | Takemura et al. |
| 8,638,123 B2 | 1/2014 | Ohnuki |
| 8,809,850 B2 | 8/2014 | Yamazaki |
| 9,122,896 B2 | 9/2015 | Ohnuki |
| 9,430,735 B1 | 8/2016 | Vali et al. |
| 9,851,942 B2 | 12/2017 | Kurokawa |
| 9,860,465 B2 | 1/2018 | Ohmaru |
| 10,141,069 B2 | 11/2018 | Ikeda et al. |
| 10,699,794 B2 | 6/2020 | Ikeda et al. |
| 11,004,528 B2 | 5/2021 | Ikeda et al. |
| 2003/0107688 A1 | 6/2003 | Yamagishi |
| 2004/0084727 A1* | 5/2004 | Ueda ................ H01L 27/11585 257/347 |
| 2012/0297221 A1 | 11/2012 | Ohnuki |
| 2016/0343452 A1 | 11/2016 | Ikeda et al. |
| 2017/0063351 A1 | 3/2017 | Kurokawa |
| 2017/0116512 A1 | 4/2017 | Kurokawa |
| 2017/0118479 A1 | 4/2017 | Kurokawa |
| 2017/0270405 A1 | 9/2017 | Kurokawa |
| 2017/0301376 A1 | 10/2017 | Kurokawa |
| 2017/0317085 A1 | 11/2017 | Kurokawa |
| 2017/0337884 A1 | 11/2017 | Kurokawa |
| 2018/0005566 A1 | 1/2018 | Kurokawa |
| 2021/0264998 A1 | 8/2021 | Ikeda et al. |

FOREIGN PATENT DOCUMENTS

| | | |
|---|---|---|
| JP | 2000-057244 A | 2/2000 |
| JP | 2016-218513 A | 12/2016 |
| JP | 2016-219011 A | 12/2016 |

OTHER PUBLICATIONS

Merrikh Bayat.F et al., "Redesigning Commercial Floating-Gate Memory for Analog Computing Applications", ISCAS 2015 (IEEE International Symposium on Circuits and Systems), May 1, 2015, pp. 1921-1924.

* cited by examiner

411

413

414

415

DATA PROCESSING DEVICE USING NEURAL NETWORK, ELECTRONIC COMPONENT, AND ELECTRONIC DEVICE

BACKGROUND OF THE INVENTION

1. Field of the Invention

One embodiment of the present invention relates to a data processing device, particularly a data processing device using a neural network, an electronic component, and an electronic device.

2. Description of the Related Art

Research on machine learning by artificial intelligence using an artificial neural network (hereinafter referred to as neural network) is thriving. As a circuit configuration of a neural network, a circuit configuration using an analog circuit has been proposed (e.g., Patent Documents 1 and 2).

Patent Document 3 discloses an electronic device configured to hold an analog signal utilizing that a leakage current (off-state current) of a transistor including an oxide semiconductor (OS transistor) in the off-state is extremely small.

REFERENCE

Patent Reference

[Patent Document 1] Japanese Published Patent Application No. H5-012466
[Patent Document 2] Japanese Published Patent Application No. H6-187472
[Patent Document 3] United States Patent Application Publication No. 2016/0343452

SUMMARY OF THE INVENTION

A digital signal is used in a general computer. Data processing is performed in a digital circuit. A digital signal is used in most elements such as a sensor module. In contrast, in a circuit configuration using an OS transistor, an analog signal can be held and thus analog computing is suitable.

When computing is performed in a neural network, not only feedforward computing but also feedback computing needs to be performed like back propagation. If a circuit is designed to perform such computing using only an analog signal, the design must be complicated. It is effective to combine part of a digital circuit and part of an analog circuit in order to use their advantages. However, a digital-to-analog converter (DAC) and an analog-to-digital converter (ADC) are needed for frequent conversion between a digital signal and an analog signal. In addition, a power source circuit for each of the ADC and DAC is needed. This causes a problem of increase in the occupied area on a chip in response to increase in circuit size.

An object of one embodiment of the present invention is to provide a data processing device, particularly a data processing device using a neural network, with a novel structure that can suppress increase in circuit size.

One embodiment of the present invention is a data processing device using a neural network comprising an input layer, a hidden layer, and an output layer. The hidden layer comprises a digital-to-analog converter, a first neuron circuit, a second neuron circuit, and a comparator. Each of the first neuron circuit and the second neuron circuit comprises a first potential holding circuit and a second potential holding circuit. The first potential holding circuit and the second potential holding circuit are electrically connected to the same bit line. The first potential holding circuit is configured to hold a potential of a first analog signal. The second potential holding circuit is configured to hold a potential of a second analog signal. The first potential holding circuit comprises a first transistor, a second transistor, and a third transistor. A gate of the second transistor is electrically connected to one of a source and a drain of the first transistor. A gate of the third transistor is electrically connected to a first wiring to which a first digital signal is supplied. The second potential holding circuit comprises a fourth transistor, a fifth transistor, and a sixth transistor. A gate of the fifth transistor is electrically connected to one of a source and a drain of the fourth transistor. A gate of the sixth transistor is electrically connected to a second wiring to which a second digital signal is supplied. A third analog signal is output from the first neuron circuit to the second neuron circuit, is input to the comparator to which a reference voltage is applied, is converted into a third digital signal, and is output to the gate of the third transistor included in the second neuron circuit or the gate of the sixth transistor included in the second neuron circuit.

In the data processing device of one embodiment of the present invention, it is preferable that the third analog signal be a signal obtained by adding a product of the first analog signal and the first digital signal to a product of the second analog signal and the second digital signal.

In the data processing device of one embodiment of the present invention, it is preferable that the first transistor and the fourth transistor be each a transistor including an oxide semiconductor.

In the data processing device of one embodiment of the present invention, it is preferable that the second transistor, the third transistor, the fifth transistor, and the sixth transistor be each a transistor including silicon.

Note that other embodiments of the present invention will be described in the following embodiments with reference to the drawings.

One embodiment of the present invention can provide a data processing device, particularly a data processing device using a neural network, with a novel structure that can suppress increase in circuit size.

DETAILED DESCRIPTION OF THE INVENTION

Figure 1A:
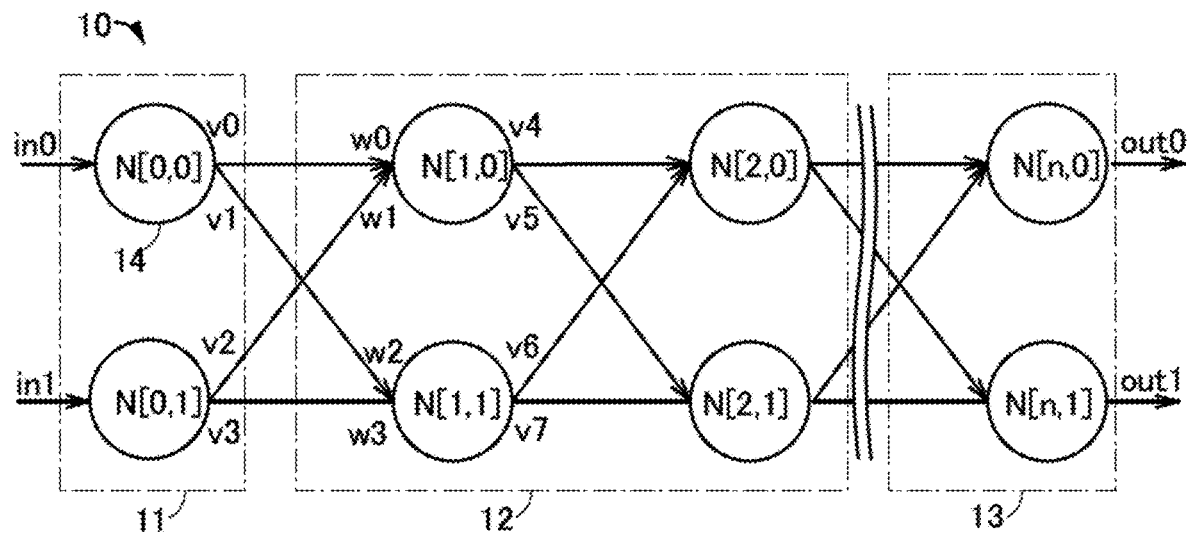
FIGS. 1A and 1B are a conceptual diagram and a block diagram for describing one embodiment of the present invention.

Hereinafter, embodiments will be described with reference to drawings. However, the embodiments can be implemented with various modes. It will be readily appreciated by those skilled in the art that modes and details can be changed in various ways without departing from the spirit and scope of the present invention. Thus, the present invention should not be interpreted as being limited to the following description of the embodiments.

In this specification and the like, ordinal numbers such as "first", "second", and "third" are used in order to avoid confusion among components. Thus, the terms do not limit the number of components. Moreover, the terms do not limit the order of components.

The same elements or elements having similar functions, elements formed using the same material, elements formed at the same time, or the like in the drawings are denoted by the same reference numerals, and the description thereof is not repeated in some cases.

Embodiment 1

Described in this embodiment is an example of the structure and operation of a data processing device capable of storing (holding) data.

FIG. 1A is a circuit diagram for illustrating the example of the structure of a data processing device 10 using a neural network.

The data processing device 10 performs data processing using a hierarchical neural network. The data processing device 10 includes an input layer 11, a hidden layer 12, and an output layer 13. FIG. 1A illustrates n layers of neuron circuits (hereinafter referred to as neurons) which imitate neurons. In FIG. 1A, input signals are input from the left and output to the right, and processing is performed in each neuron 14.

In the input layer 11, N[0,0] and N[0,1] are illustrated as the neurons 14. An input signal in0 and an input signal in1 are input to the input layer 11. "v0" and "v1" shown in the input layer 11 are output signals from N[0,0] in response to input of the input signal in0. "v2" and "v3" in FIG. 1A are output signals from N[0,1] in response to input of the input signal in1. The number of neurons 14 illustrated in the input layer 11 is two; however, the more the number of input is, the better. To increase the accuracy, 1000 or more neurons are preferably provided.

In the output layer 13, N[n,0] and N[n,1] are illustrated as the neurons 14. An output signal out0 and an output signal out1 are output from the output layer 13.

In the hidden layer 12, N[1,0], N[1,1], N[2,0], and N[2,1] are illustrated as the neurons 14. Although a two-layer hidden layer including 2×2 neurons is illustrated as the hidden layer 12, the number of neuron layers for a hidden layer is preferably three or more to increase the accuracy. "w0" and "w1" shown in the hidden layer 12 correspond to weight coefficients of N[1,0]. "w2" and "w3" shown in the hidden layer 12 correspond to weight coefficients of N[1,1]. "v4" and "v5" shown in the hidden layer 12 are output signals from N[1,0] in response to input of "v0" and "v2" to N[1,0]. "v6" and "v7" shown in the hidden layer 12 are output signals from N[1,1] in response to input of "v1" and "v3" to N[1,1].

In the hidden layer 12, product-sum operation between input signals and weight coefficients is performed to determine an output signal by comparison with a threshold value. The operation corresponds to the role of a synapse of a neuron. The product-sum operation is arithmetic for calculating a value obtained by adding values each obtained by multiplying an input signal and a weight coefficient together, for example, "w0×v0+w1×v2".

Note that in the hidden layer 12, holding (storing) of weight coefficients of analog values, such as "w0" and "w1", is performed in a potential holding circuit having a circuit configuration using an OS transistor. The configuration of the potential holding circuit is described in detail in FIGS. 3A and 3B and FIG. 4.

Digital signals are used as the input signal in0 and the input signal in1 that are input to the input layer 11. "v0", "v1", "v2", and "v3" that are output from the input layer 11 are digital signals. In contrast, an analog signal can be held in a circuit configuration using an OS transistor, and analog computing is suitable. Accordingly, a value obtained by the product-sum operation is an analog value.

One embodiment of the present invention is configured to use an analog signal obtained by product-sum operation without conversion into a multi-bit digital signal by an analog-to-digital converter. Specifically, an analog value obtained by product-sum operation is compared to a reference voltage corresponding to a threshold value in a comparator. Then, "1" or "0", that is an H-level or L-level digital signal, is outputted, and whether a synapse fires or not is determined. Thus, "v4", "v5", "v6", and "v7" that are output from neurons in the hidden layer 12 are digital signals. Therefore, in the hidden layer 12, input and output of signals can be performed without frequent conversion between a digital signal and an analog signal. As a result, circuits such as a DAC and an ADC become unnecessary, and power source circuits for the ADC and DAC become unnecessary as well, which can suppress increase in the occupied area on a chip in response to increase in circuit size.

When computing is performed in a neural network, not only feedforward computing but also feedback computing needs to be performed like back propagation. If a circuit is designed to perform such computing using only an analog signal, the design must be complicated. It is effective to combine part of a digital circuit and part of an analog circuit in order to use their advantages.

The above-described structure of one embodiment of the present invention is described in more detail with reference to a block diagram of FIG. 1B. In the hidden layer in FIG. 1B, the digital-to-analog converter 21, a neuron 22$i$ in a first layer, and a neuron 22$j$ in a second layer are illustrated. Each of the neuron 22$i$ and the neuron 22$j$ includes the digital-to-analog converters 21, comparators 23, and a plurality of potential holding circuits 24.

The digital-to-analog converter 21 is a circuit for converting a digital signal corresponding to a weight coefficient to an analog value. In FIG. 1B, as an example, weight coefficients $A_0$ to $A_7$ converted into analog values are shown. The weight coefficients $A_0$ to $A_7$ are held in a plurality of potential holding circuits 24 arranged in the column direction of FIG. 1B and included in the neuron 22$i$ and the neuron 22$j$.

Figure 1B:
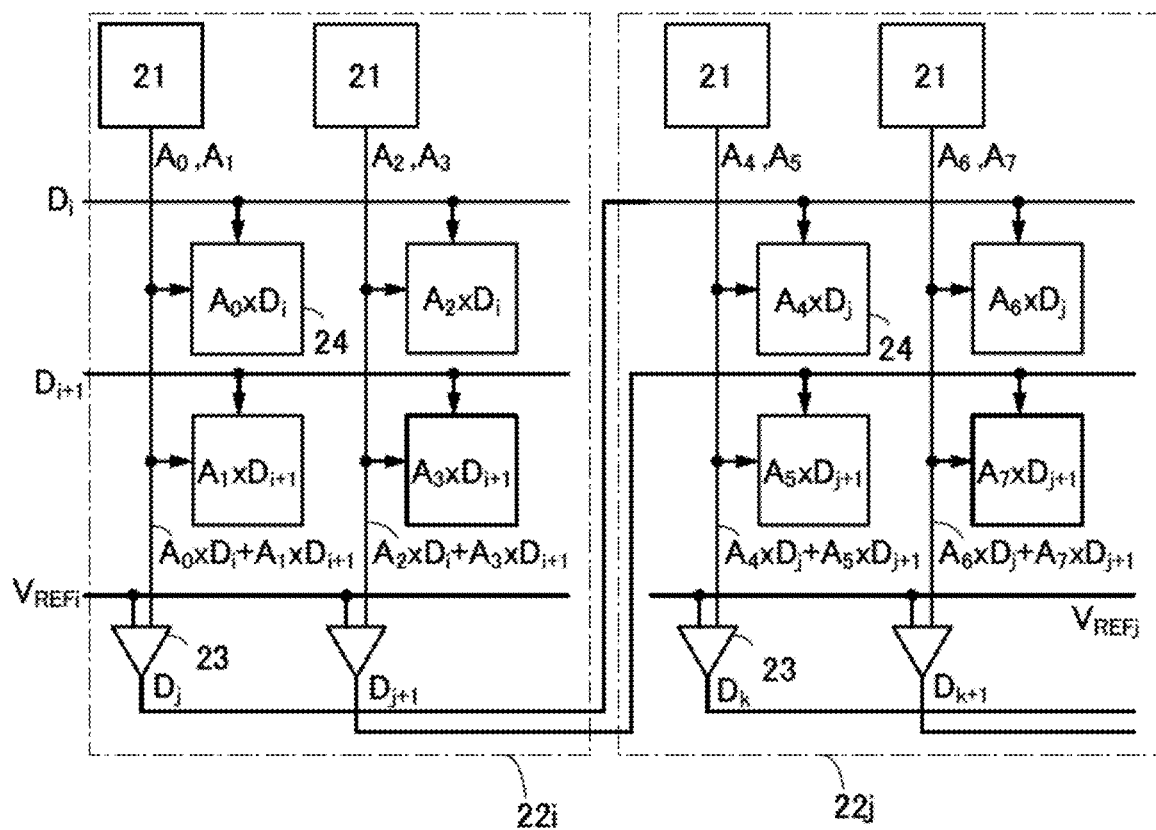

In FIG. 1B, as an example, signals $D_i$ and $D_{i+1}$ are shown as digital signals output from neurons in the input layer (the previous layer). The signals $D_i$ and $D_{i+1}$ are input to a plurality of potential holding circuits 24 arranged in the row direction of FIG. 1B and included in the neuron 22$i$. In FIG. 1B, as an example, signals $D_j$ and $D_{j+1}$ are shown as digital signals output from the neuron 22$i$. The signals $D_j$ and $D_{j+1}$ are input to a plurality of potential holding circuits 24 arranged in the row direction of FIG. 1B and included in the neuron 22$j$. In FIG. 1B, as an example, signals $D_k$ and $D_{k+1}$ are shown as digital signals output from the neuron 22$j$.

In the plurality of potential holding circuits 24 included in the neuron 22$i$ shown in FIG. 1B, the weight coefficients $A_0$ to $A_7$ are held, the signal $D_i$ or $D_{i+1}$ is input from the row direction, and multiplication between respective values (e.g., $A_0 \times D_i$ shown in FIG. 1B) can be performed. The values obtained by the multiplication are converted into current flowing through the wirings (bit lines) connected to the potential holding circuits 24. The weight coefficients $A_0$ to $A_7$ are signals having analog values. The signals $D_i$ and $D_{i+1}$ are digital signals. Thus, in each of the potential holding circuits 24, whether to flow current in response to the weight coefficients is determined by the signals $D_i$ or $D_{i+1}$. In addition, current flowing through the potential holding circuit 24 is converted into current flowing through a wiring (bit line) connected to the potential holding circuit; thus, current flowing through a wiring (bit line) connected to a plurality of potential holding circuits 24 are added up together. Accordingly, a value (e.g., $A_0 \times D_i + A_1 \times D_{i+1}$ in FIG. 1B) obtained by adding the products in the potential holding circuits is obtained through a wiring (bit line). In other words, product-sum operation between analog signals input to the potential holding circuit 24 and digital signals can be performed.

Since the value obtained by the product-sum operation is a current value, the current value is converted into a voltage value using a current source or the like. The value obtained by the product-sum operation and converted into a voltage value is input to the comparator 23. A reference voltage corresponding to a threshold value of a synapse is input to the comparator 23, and the comparator 23 outputs "1" or "0", that is an H-level or L-level digital signal. The output of the comparator 23 corresponds to the determination whether a synapse fires or not. The signals $D_j$ and $D_{j+1}$ obtained in the comparator 23 are digital signals input to the neuron 22$j$ of the next-stage hidden layer.

One embodiment of the present invention is configured to use an analog signal obtained by product-sum operation without conversion into a multi-bit digital signal by an analog-to-digital converter. Specifically, an analog value obtained by product-sum operation is compared to a reference voltage corresponding to a threshold value in a comparator. Then, "1" or "0", that is an H-level or L-level digital signal, is outputted, and whether a synapse fires or not is determined. Thus, signals output from neurons in the hidden layer 12 are 1-bit digital signals. Therefore, in the hidden layer 12, input and output of signals can be performed without frequent conversion between a digital signal and an analog signal. As a result, circuits such as a DAC and an ADC become unnecessary, and power source circuits for the ADC and DAC become unnecessary as well, which can suppress increase in the occupied area on a chip in response to increase in circuit size.

Figure 2:
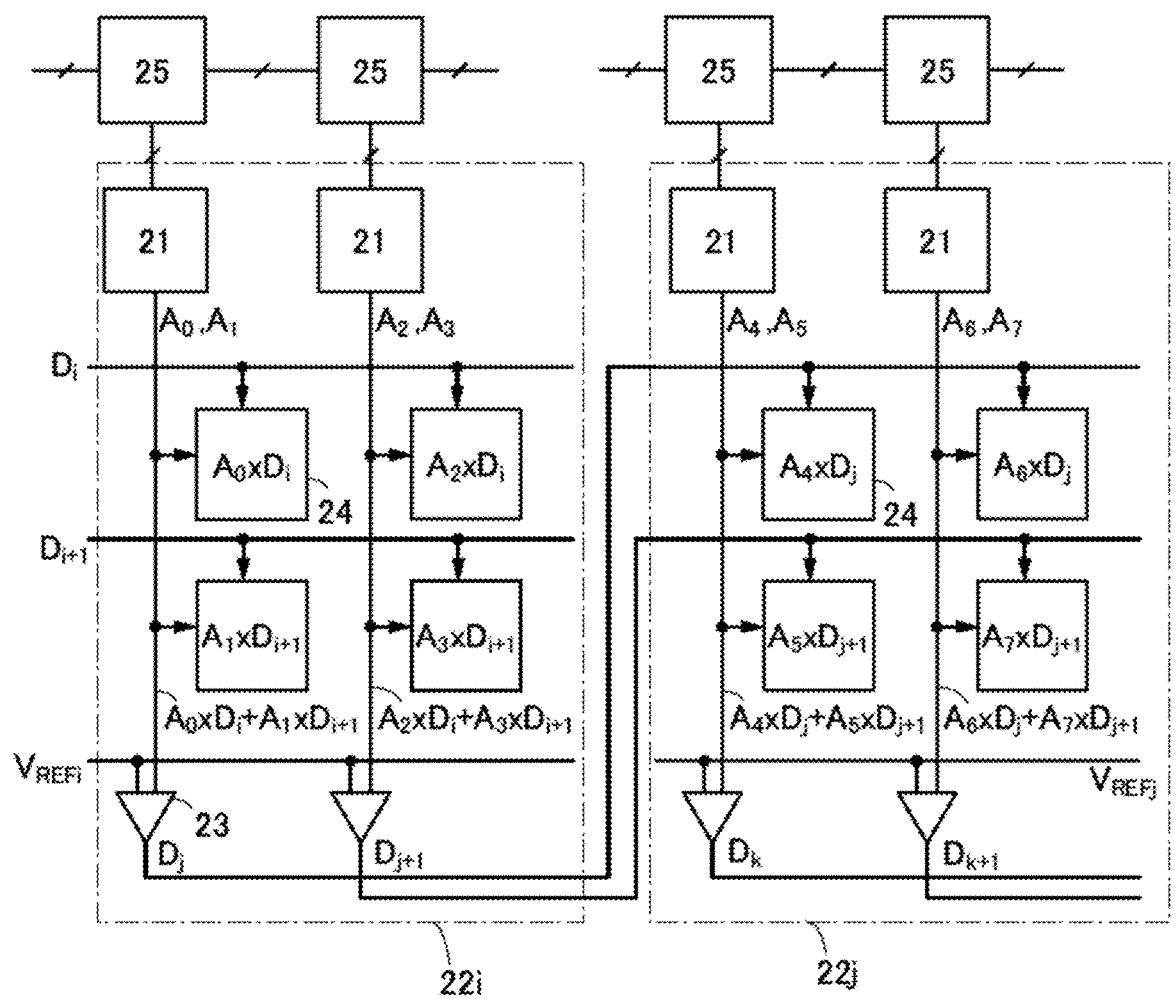
FIG. 2 is a block diagram for describing one embodiment of the present invention.

In the block diagram of FIG. 2, a register chain 25 for inputting the digital signals corresponding to the weight coefficients which are input to the digital-to-analog converter 21, which are shown in FIG. 1B, is shown. A shift register or a decoder may be used without limitation to a register chain.

Figure 3A:
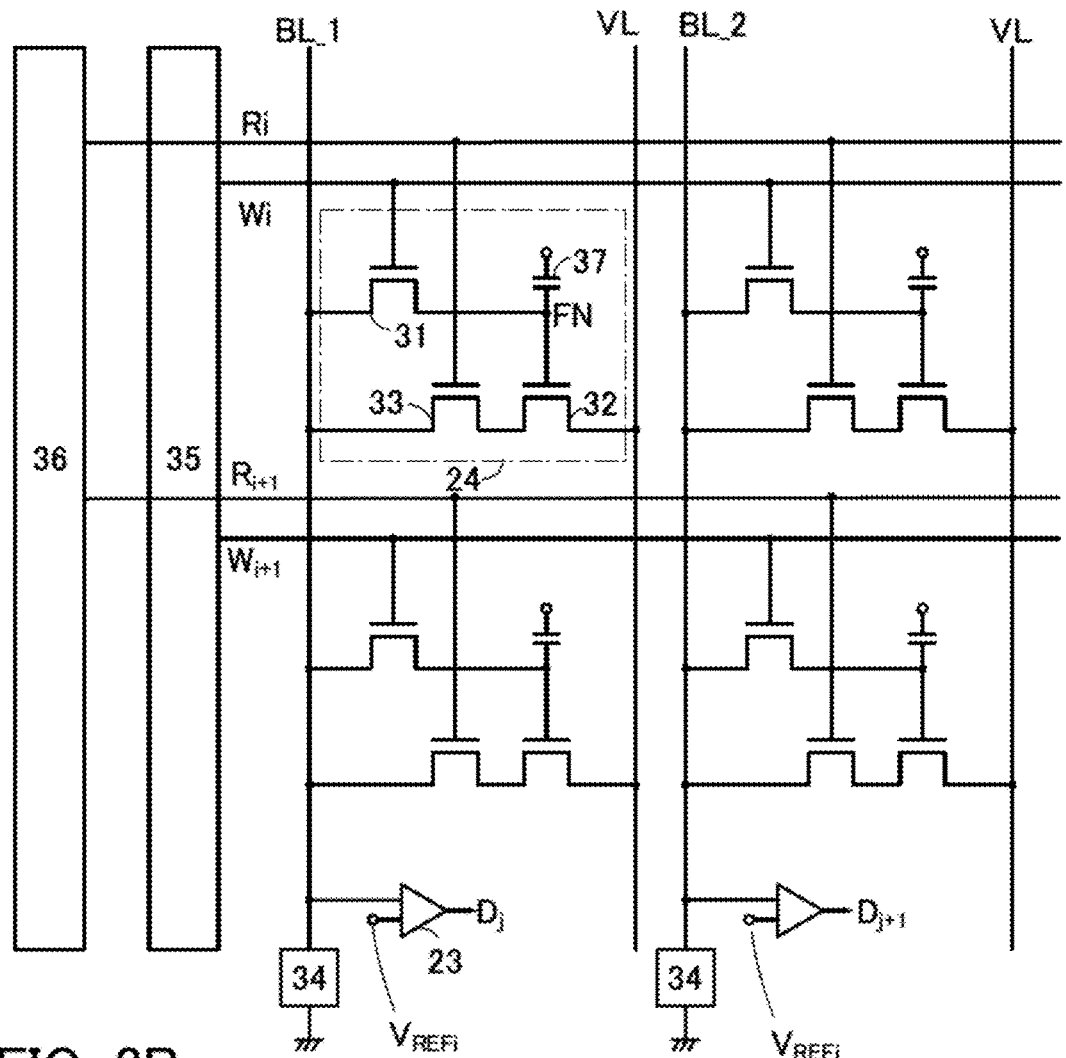
FIGS. 3A and 3B are a circuit diagram and a timing chart for describing one embodiment of the present invention.

FIG. 3A is a circuit diagram showing a specific configuration example of the potential holding circuit 24 described in FIG. 1B and an example of peripheral circuits. The potential holding circuit 24 includes a transistor 31, a transistor 32, a transistor 33, and a capacitor 37. In FIG. 3A, bit lines BL_1 and BL_2 are shown as wirings connected to the plurality of potential holding circuits 24. In FIG. 3A, a power source line VL for supplying current in response to the analog signal held in the potential holding circuit 24 is shown. In FIG. 3A, current sources 34 for conversion into voltage values of the bit lines BL_1 and BL_2 in accordance with current flowing in the plurality of potential holding circuits 24 are shown. In FIG. 3A, wirings $W_i$ and $W_{i+1}$ to which word signals for controlling the on/off state of the transistors 31 are supplied are shown. In FIG. 3A, wirings $R_i$ and $R_{i+1}$ to which digital signals for controlling the on/off state of the transistors 33 are supplied are shown. In FIG. 3A, a shift register 35 for outputting the word signals supplied to the wirings $W_i$ and $W_{i+1}$ is shown. In FIG. 3A, a shift chain 36 for outputting the digital signals supplied to the wirings $R_i$ and $R_{i+1}$ is shown.

A connection example of the transistors included in the potential holding circuit 24 will be described. A gate of the transistor 31 is connected to the wiring $W_i$. One of a source and a drain of the transistor 31 is connected to the bit line BL_1. The other of the source and the drain of the transistor 31 is electrically connected to a gate of the transistor 32. A gate of the transistor 32 is referred to as a node FN. The gate of the transistor 32 is connected to one electrode of a capacitor 37. The other electrode of the capacitor 37 is connected to another wiring (not shown). One of a source and a drain of the transistor 32 is connected to one of a source and a drain of the transistor 33. The other of the source and the drain of the transistor 32 is connected to a power source line VL. A gate of the transistor 33 is connected to the wiring $R_i$. One of a source and a drain of the transistor 33 is connected to the one of the source and the drain of the transistor 32. The other of the source and the drain of the transistor 33 is connected to the bit line BL_1.

In FIG. 3A, the transistors 31, 32, and 33 are all n-channel transistors. That is, each transistor is turned on when an H-level signal is applied to the gate and turned off when an L-level signal is applied to the gate. Note that the transistors may be p-channel transistors, in which case the logic of a signal of each wiring is inverted.

When the transistor 31 is turned off, the potential holding circuit 24 can hold charge corresponding to an analog potential. The charge corresponding to the analog potential is held in the node FN. It is preferable that the transistor 31 be a transistor having an extremely low leakage current in the off state. A transistor including an oxide semiconductor in a channel formation region (an OS transistor) is suitable for such a transistor. The OS transistor can operate at high voltages because it has a high maximum voltage that can be applied between a source and a drain or between the source and a gate (has high withstand voltage). Thus, the potential change of the bit line BL_1 due to an analog potential can be made large.

The leakage current of an OS transistor normalized by channel width can be lower than or equal to $10 \times 10^{-21}$ A/μm (10 zA/μm) with a source-drain voltage of 10 V at room temperature (approximately 25° C.). It is preferable that the leakage current of the OS transistor used as the transistor 31 be lower than or equal to $1 \times 10^{-18}$ A, lower than or equal to $1 \times 10^{-21}$ A, or lower than or equal to $1 \times 10^{-24}$ A at room temperature (approximately 25° C.). Alternatively, the leakage current is preferably lower than or equal to $1 \times 10^{-15}$ A, lower than or equal to $1 \times 10^{-18}$ A, or lower than or equal to $1 \times 10^{-21}$ A at 85° C.

An oxide semiconductor is a semiconductor which has a large energy gap and in which electrons are unlikely to be excited and the effective mass of a hole is large. Accordingly, an avalanche breakdown and the like are less likely to occur in the OS transistor than in a generally-used transistor using silicon or the like. Since hot-carrier degradation or the like due to the avalanche breakdown is inhibited, the transistor including an oxide semiconductor in its channel formation region has high drain withstand voltage and can be driven at high drain voltage.

An oxide semiconductor contained in a channel formation region of a transistor is preferably an oxide semiconductor containing at least one of indium (In) and zinc (Zn). Typical examples of such an oxide semiconductor include In oxide, Zn oxide, In—Zn oxide, and In-M-Zn oxide (M is Ga, Al, Ti, Y, Zr, La, Ce, Nd, or Hf). Reductions in impurities serving as electron donors, such as hydrogen, and in oxygen vacancies can make an oxide semiconductor almost i-type (intrinsic) or substantially i-type. Such an oxide semiconductor can be referred to as a highly purified oxide semiconductor.

An oxide semiconductor with low carrier density is preferably formed for a channel formation region. The carrier density of the oxide semiconductor is preferably less than $8 \times 10^{11}/cm^3$ and greater than or equal to $1 \times 10^{-9}/cm^3$. The carrier density is preferably less than $1 \times 10^{11}/cm^3$, and further preferably less than $1 \times 10^{10}/cm^3$.

It is preferable that each of the transistors 32 and 33 be preferably an OS transistor or a transistor including silicon in its channel formation region (a Si transistor). The use of a Si transistor as each of the transistors 32 and 33 can reduce a variation in threshold voltage and increase the amount of current flowing between the source and the drain in the on state. When each of the transistors 32 and 33 is a Si transistor, they can be stacked with the aforementioned transistor 31 which is an OS transistor. The structure can reduce the area occupied by the potential holding circuit 24.

An analog signal is input from the wiring shown as the bit line BL_1 to the potential holding circuit 24. Moreover, the potential holding circuit 24 has a function of generating current corresponding to the analog signal. Specifically, the potential holding circuit 24 can generate drain current of the transistor 32 obtained when the analog signal is supplied to the gate of the transistor 32.

Note that the drain current of the transistor 32 operating in a saturation region is not dependent on voltage between a source and a drain and is controlled by the difference between its gate voltage and threshold voltage. Thus, the transistor 32 desirably operates in a saturation region. The gate voltage and the voltage between the source and the drain of the transistor 32 are each appropriately set to a voltage at which the transistor 32 operates in a saturation region.

The potential holding circuit 24 has a function of holding a potential corresponding to the analog signal (analog potential). In other words, the potential holding circuit 24 has a function of holding the analog potential and generating current corresponding to the analog potential.

In addition, a digital signal is input to the potential holding circuit 24 through a wiring shown as the wiring $R_i$. A digital signal supplied to the wiring shown as the wiring $R_i$ is a signal for controlling the on/off state of the transistors 33. In other words, the potential holding circuit 24 has a function of determining whether to flow current corresponding to the analog potential that has already been held between the source and the drain of the transistor 32.

Note that in the case where the transistor 33 operates in a linear region, the transistor can be controlled so as to function as a switch. Thus, the transistor 33 desirably operates in a linear region. The gate voltage and the voltage between the source and the drain of the transistor 33 are each appropriately set to a voltage at which the transistor 33 operates in a linear region.

Figure 3B:
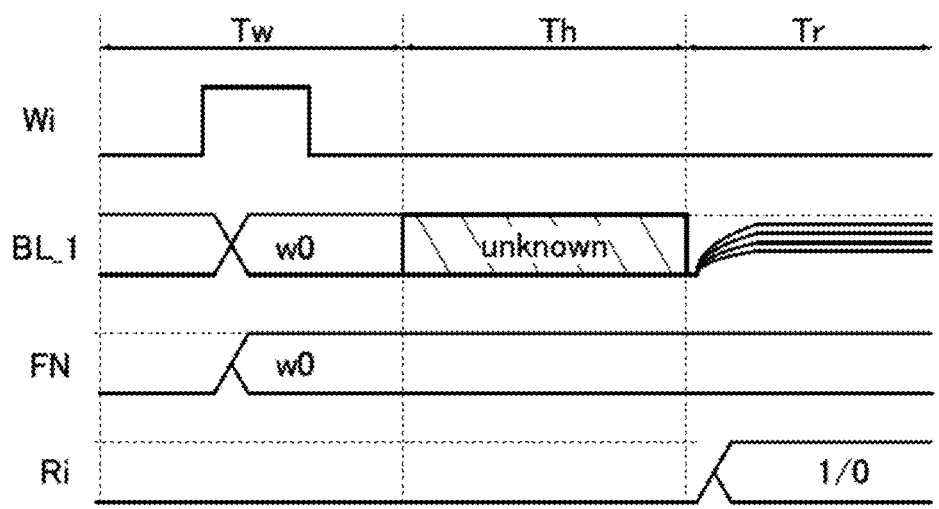

FIG. 3B is a timing chart for describing, in the circuit diagram shown in FIG. 3A, operation in writing an analog potential to the potential holding circuit 24, operation in holding the analog potential in the potential holding circuit 24, and operation in multiplication of the analog potential held in the potential holding circuit 24 and a digital signal. In FIG. 3B, to describe an example, changes of signals or potentials applied to the wiring $W_i$, the bit lint BL_1, the node FN, and the wiring $R_i$ in the circuit diagram shown in FIG. 3A are shown.

A period Tw shown in FIG. 3B is a period for performing writing of an analog potential to the potential holding circuit 24. In the period Tw, the wiring $W_i$ is set at an H level to turn on the transistor 31, and an analog potential corresponding to the weight coefficient (w0) applied to the bit line BL_1 is written to the node FN. In the period Tw, the wiring $R_i$ is set at a L level.

A period Th shown in FIG. 3B is a period for performing holding of the analog potential in the potential holding circuit 24. In the period Th, the wiring $W_i$ is set at an L level to turn off the transistor 31, and the analog potential corresponding to the weight coefficient (w0) is held in the node FN. In the period Th, the wiring $R_i$ is set at an L level. The bit line BL_1 has an unknown value ("unknown").

A period Tr shown in FIG. 3B is a period for performing multiplication of the analog potential and a digital signal in the potential holding circuit 24. In the period Tr, the wiring $R_i$ is set at an H level or an L level (1/0) in accordance with the logic of the digital signal to turn on or off the transistor 33. Current flows between the bit line BL_1 and the power source line VL in accordance with the analog potential held in the node FN, and the potential of the bit line is changed. Current flowing in the potential holding circuit 24 flows also in other potential holding circuits 24 connected to the same bit line; thus, the potential of the bit line varies depending on the total current flowing in the potential holding circuits 24. In the period Th, the wiring $W_i$ is set at an L level.

Figure 4:
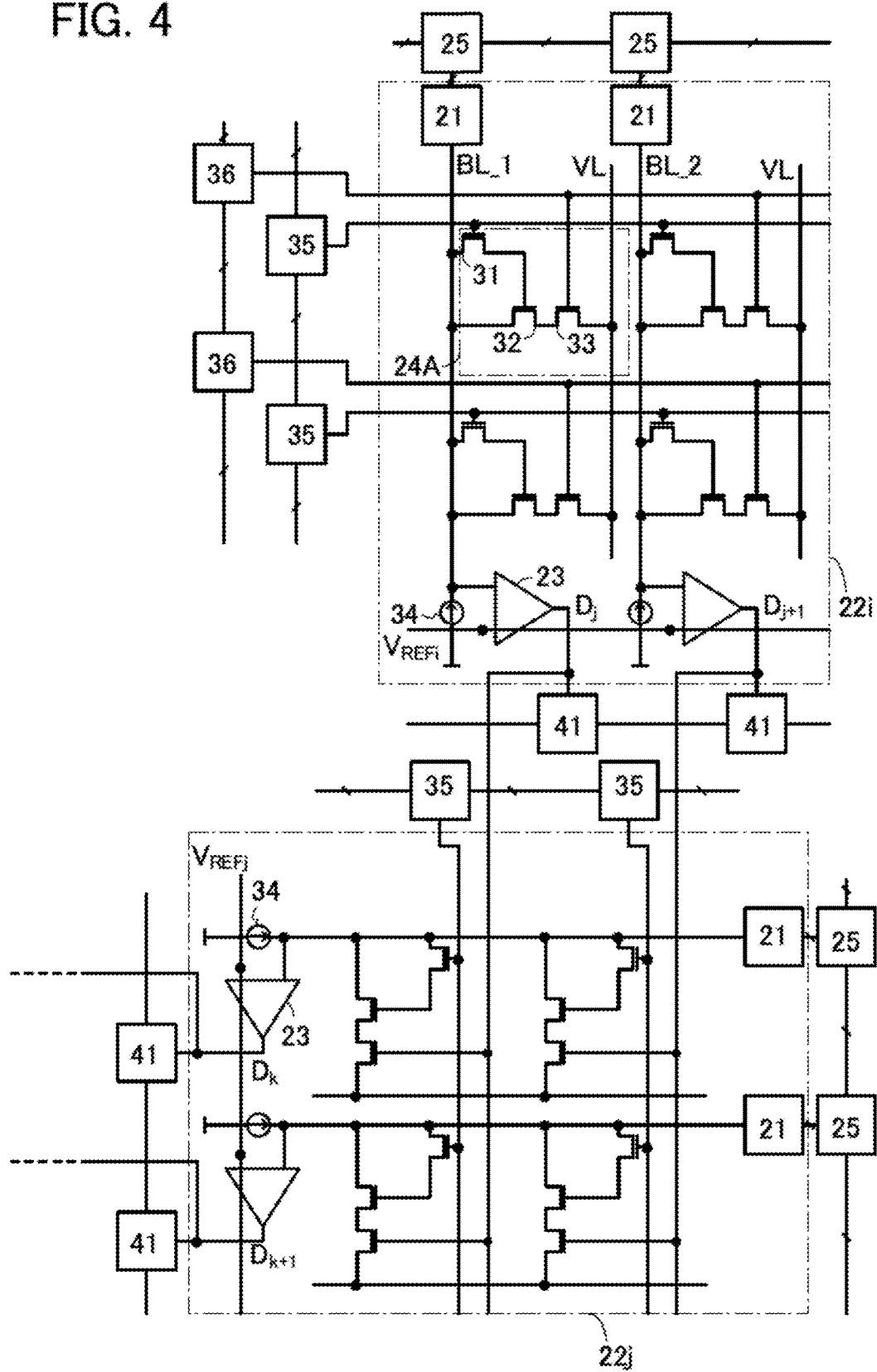
FIG. 4 is a circuit diagram for describing one embodiment of the present invention.

FIG. 4 shows a circuit diagram when the configurations of FIG. 1B, FIG. 2, and FIG. 3A are combined.

A potential holding circuit 24A shown in FIG. 4 is different from the potential holding circuit 24 shown in FIG. 3A in the position of the transistor 33. In addition, in FIG. 4, a scan chain 41 is shown between the neuron 22$i$ and the neuron 22$j$. With this configuration, arithmetic results obtained in the neuron 22$i$ can be output to the outside and subjected to back propagation, and the results can be input to the neuron.

With the use of the above-described data processing device as a feature extraction filter for convolution or a fully connected arithmetic circuit, the feature amount can be extracted using a convolutional neural network (CNN). Specifically, with the use of the data processing device that can be used for a hierarchical neural network, a parameter used for image data correction can be determined by machine learning.

Figure 5:
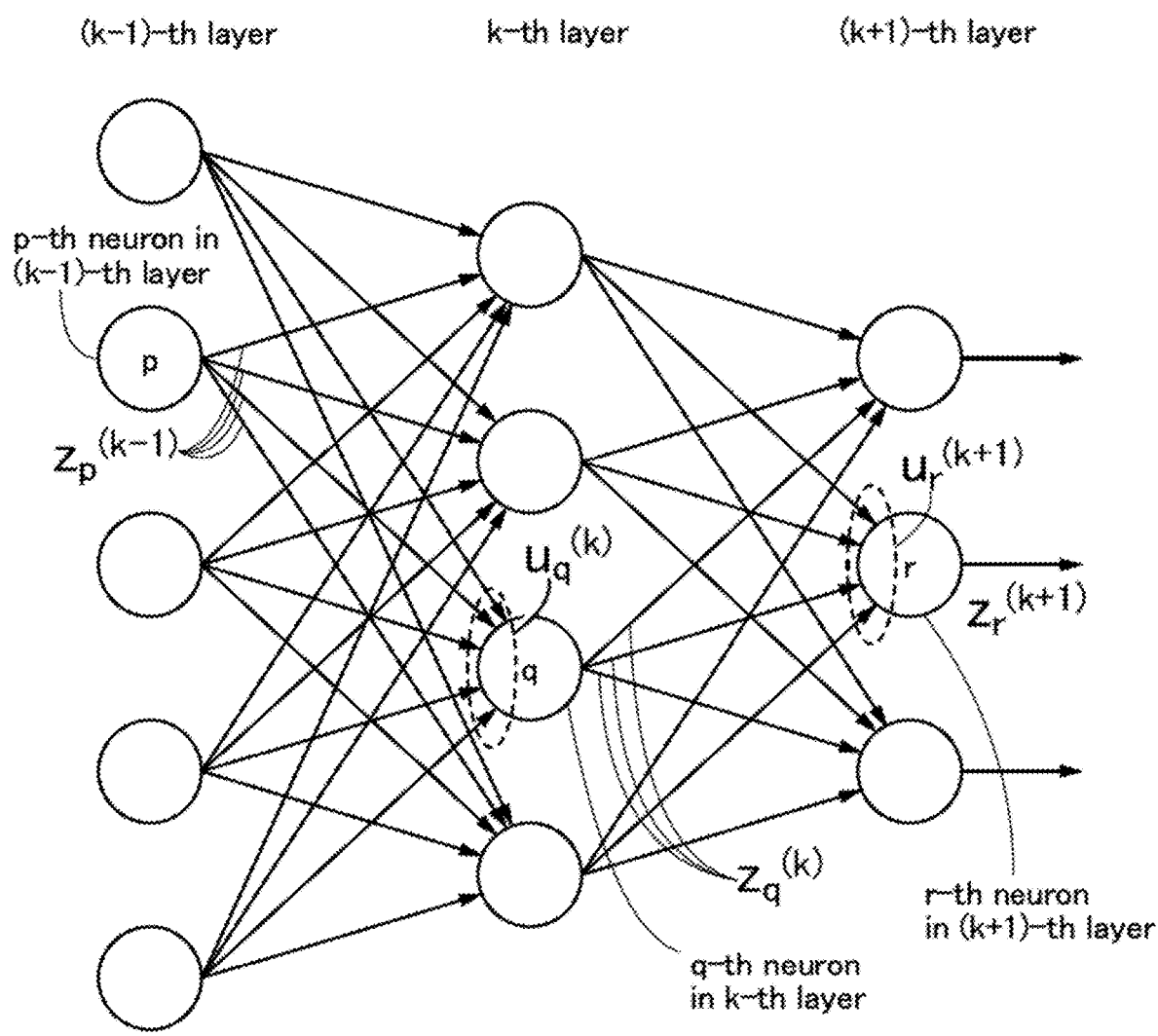
FIG. 5 is a diagram showing an example of a hierarchical neural network.

FIG. 5 is a diagram showing an example of a hierarchical neural network. A (k−1)-th layer (k is an integer greater than or equal to 2) includes P neurons (P is an integer greater than or equal to 1). A k-th layer includes Q neurons (Q is an integer greater than or equal to 1). A (k+1)-th layer includes R neurons (R is an integer greater than or equal to 1).

The product of an output signal $z_p^{(k-1)}$ of the p-th neuron (p is an integer greater than or equal to 1 and less than or equal to P) in the (k−1)-th layer and a weight coefficient $w_{qp}^{(k)}$ is input to the q-th neuron (q is an integer greater than or equal to 1 and less than or equal to Q) in the k-th layer. The product of an output signal $z_q^{(k)}$ of the q-th neuron in the k-th layer and a weight coefficient $w_{rq}^{(k+1)}$ is input to the r-th neuron (r is an integer greater than or equal to 1 and less than or equal to R) in the (k+1)-th layer. The output signal of the r-th neuron in the (k+1)-th layer is $z_r^{(k+1)}$.

In this case, the sum of signals input to the q-th neuron in the k-th layer is expressed by the following formula (D1).

[Formula 1]

$$u_q^{(k)} = \Sigma w_{qp}^{(k)} z_p^{(k-1)} \qquad (D1)$$

The output signal $z_q^{(k)}$ from the q-th neuron in the k-th layer is expressed by the following formula (D2).

[Formula 2]

$$z_q^{(k)} = f(u_q^{(k)}) \qquad (D2)$$

Figure 8A:
FIGS. 8A to 8D are diagrams describing configuration examples of circuits.

A function $f(u_q^{(k)})$ is a neuron output function. A step function, a linear ramp function, a sigmoid function, or the like can be used as the function $f(u_q^{(k)})$). Product-sum operation of Formula (D1) can be performed with the above-described product-sum operation circuit. Formula (D2) can be calculated with a circuit 411 illustrated in FIG. 8A, for example.

Note that the neuron output function may be the same among all neurons or may be different among neurons. Furthermore, the neuron output function in one layer may be the same as or different from that in another layer.

Figure 6:
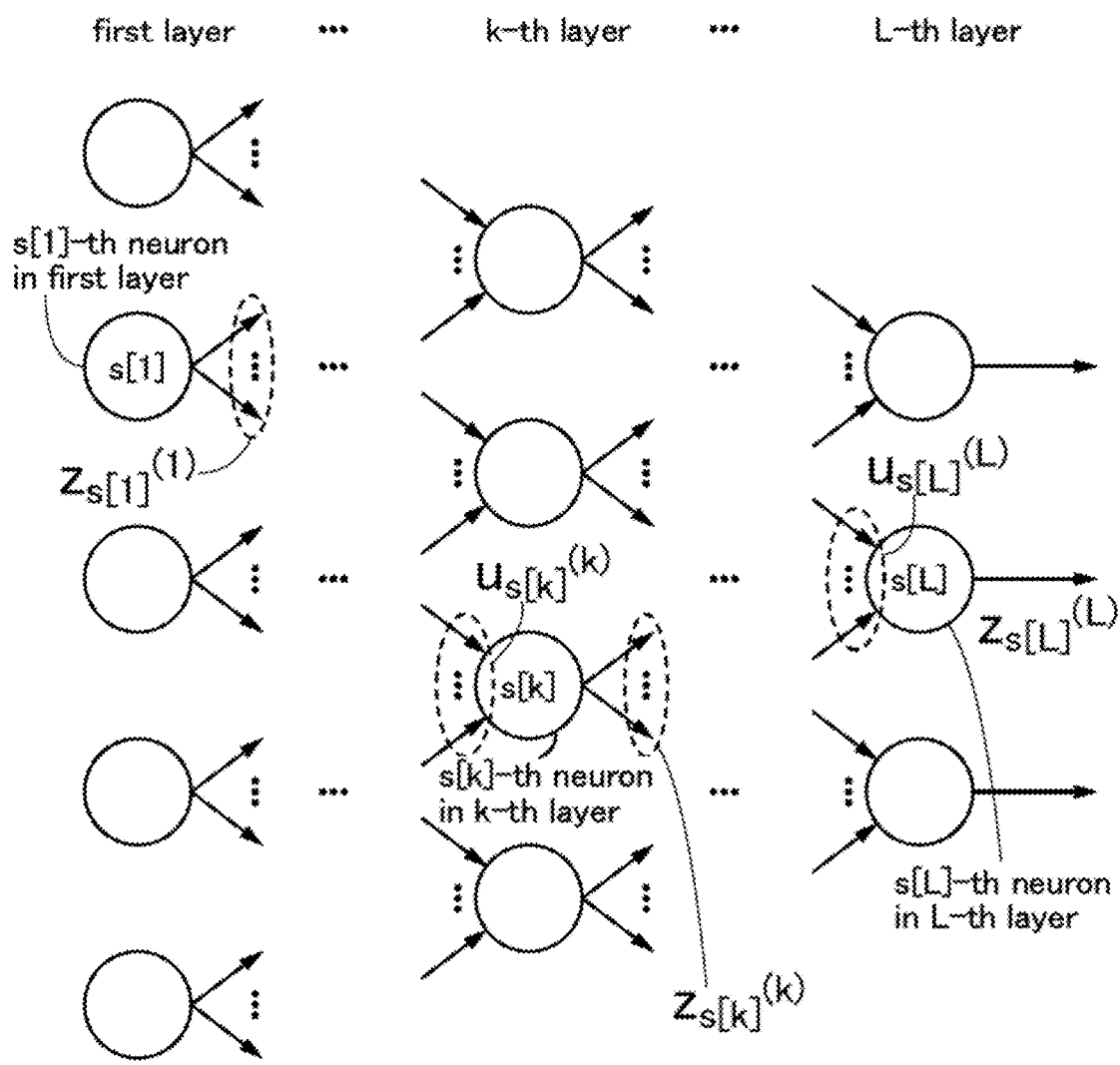
FIG. 6 is a diagram showing an example of a hierarchical neural network.

Here, a hierarchical neural network including L layers (here, L is an integer greater than or equal to three) in total shown in FIG. 6 is described (that is, here, k is an integer greater than or equal to two and less than or equal to (L−1)). A first layer is an input layer of the hierarchical neural network, an L-th layer is an output layer of the hierarchical neural network, and second to (L−1)-th layers are hidden layers.

The first layer (input layer) includes P neurons, the k-th layer (hidden layer) includes Q[k] neurons (here, Q[k] is an integer greater than or equal to 1), and the L-th layer (output layer) includes R neurons.

An output signal of the s[1]-th neuron in the first layer (here, s[1] is an integer greater than or equal to 1 and less than or equal to P) is $z_{s[1]}^{(1)}$, an output signal of the s[k]-th neuron in the k-th layer (here, s[k] is an integer greater than or equal to 1 and less than or equal to Q[k]) is $z_{s[k]}^{(k)}$, and an output signal of the s[L]-th neuron in the L-th layer (here, s[L] is an integer greater than or equal to 1 and less than or equal to R) is $z_{s[L]}^{(L)}$.

The product $u_{s[k]}^{(k)}$ of an output signal $z_{s[k-1]}^{(k-1)}$ of the s[k−1]-th neuron in the (k−1)-th layer and a weight coefficient $w_{s[k]s[k-1]}^{(k)}$ (here, s[k−1] is an integer greater than or equal to 1 and less than or equal to Q[k−1]) is input to the s[k]-th neuron in the k-th layer. The product $u_{s[L]}^{(L)}$ of an output signal $z_{s[L-1]}^{(L-1)}$ of the s[L−1]-th neuron in the (L−1)-th layer and a weight coefficient $w_{s[L]s[L-1]}^{(L)}$ (here, s[L−1] is an integer greater than or equal to 1 and less than or equal to Q[L−1]) is input to the s[L]-th neuron in the L-th layer.

Next, supervised learning will be described. Supervised learning refers to operation of updating all weight coefficients of a hierarchical neural network on the basis of an output result and a desired result (also referred to as teacher data or a teacher signal in some cases) when the output result and the desired result differ from each other, in functions of the hierarchical neural network.

Figure 7:
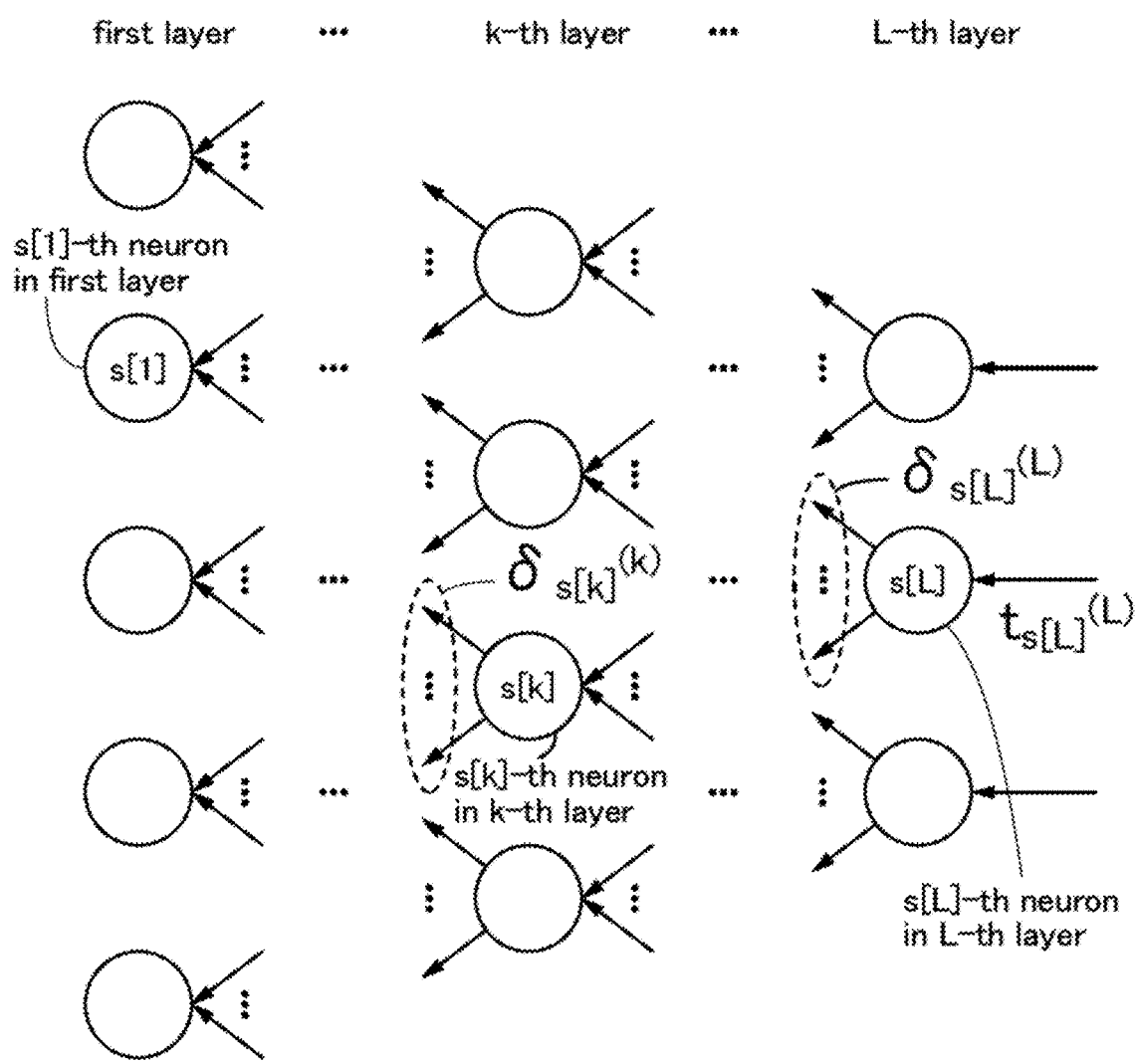
FIG. 7 is a diagram showing an example of a hierarchical neural network.

A learning method using backpropagation will be described as a specific example of supervised learning. FIG. 7 is a diagram illustrating a learning method using backpropagation. Backpropagation is a method for changing a weight coefficient so that an error between an output of a hierarchical neural network and teacher data becomes small.

For example, assume that input data is input to the s[1]-th neuron in the first layer and output data $z_{s[L]}^{(L)}$ is output from the s[L]-th neuron in the L-th layer. Here, error energy E can be expressed using output data $z_{s[L]}^{(L)}$ and a teacher signal $t_{s[L]}^{(L)}$, when a teacher signal for the output data $z_{s[L]}^{(L)}$ is $t_{s[L]}^{(L)}$.

The update amount of a weight coefficient $w_{s[k]s[k-1]}^{(k)}$ of the s[k]-th neuron in the k-th layer with respect to the error energy E is set to $\partial E/\partial w_{s[k]s[k-1]}^{(k)}$, whereby the weight coefficient can be updated. Here, when an error $\delta_{s[k]}^{(k)}$ of the output value $z_{s[k]}^{(k)}$ of the s[k]-th neuron in the k-th layer is defined as $\partial E/\partial u_{s[k]}^{(k)}$, $\delta_{s[k]}^{(k)}$ and $\partial E/\partial w_{s[k]s[k-1]}^{(k)}$ can be expressed by the following formulae (D3) and (D4).

[Formula 3]

$$\delta_{s[k]}^{(k)} = \sum_{s[k+1]} \delta_{s[k+1]}^{(k+1)} \cdot w_{s[k+1]s[k]}^{(k+1)} \cdot f'(u_{s[k]}^{(k)}) \qquad (D3)$$

[Formula 4]

$$\frac{\partial E}{\partial w_{s[k]s[k-1]}^{(k)}} = \delta_{s[k]}^{(k)} \cdot z_{s[k-1]}^{(k-1)} \qquad (D4)$$

Figure 8B:
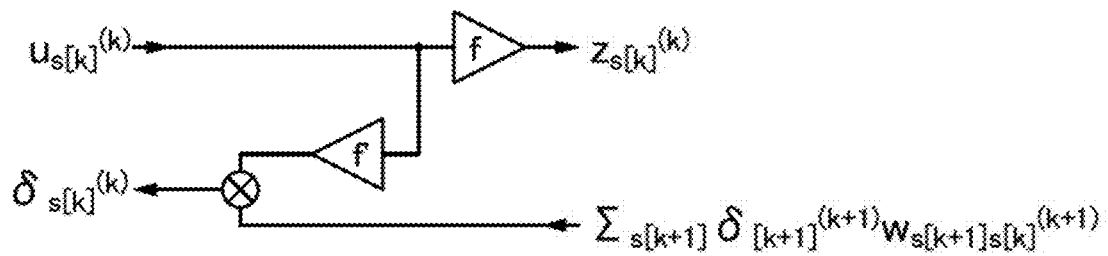
Figure 8C:
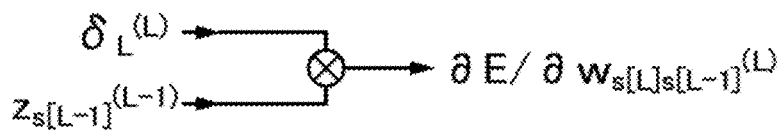

A function $f'(u_{s[k]}^{(k)})$ is the derivative of a neuron output function. Formula (D3) can be calculated with a circuit 413 illustrated in FIG. 8B, for example. Formula (D4) can be calculated with a circuit 414 illustrated in FIG. 8C, for example. The derived function of the output function can be obtained by connecting an arithmetic circuit, which can execute a desired derived function, to an output terminal of an operational amplifier.

For example, $\Sigma w_{s[k+1]s[k]}^{(k+1)} \cdot \partial_{s[k+1]}^{(k+1)}$ in Formula (D3) can be calculated with the above-described data processing device.

Here, when the (k+1)-th layer is an output layer, or the L-th layer, $\partial_{s[L]}^{(L)}$ and $\partial E/\partial w_{s[L]s[L-1]}^{(L)}$ can be expressed by the following formulae (D5) and (D6).

[Formula 5]

$$\delta_{s[L]}^{(L)} = (z_{s[L]}^{(L)} - t_{s[L]}) \cdot f'(u_{s[L]}^{(L)}) \quad (D5)$$

[Formula 6]

$$\frac{\partial E}{\partial w_{s[L]s[L-1]}^{(L)}} = \delta_{s[L]}^{(L)} \cdot z_{s[L-1]}^{(L-1)} \quad (D6)$$

Figure 8D:
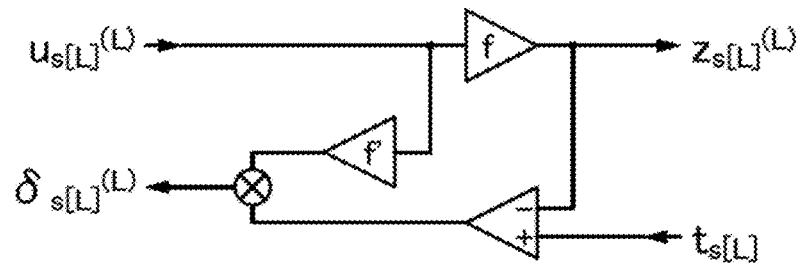

Furthermore, Formula (D5) can be calculated with a circuit 415 illustrated in FIG. 8D. Formula (D6) can be calculated with the circuit 414 illustrated in FIG. 8C.

That is to say, the errors $\delta_{s[k]}^{(k)}$ and $\delta_{s[L]}^{(L)}$ of all neuron circuits can be calculated by Formulae (D1) to (D6). Note that the update amounts of weight coefficients are set on the basis of the errors $\delta_{s[k]}^{(k)}$ and $\delta_{s[L]}^{(L)}$, predetermined parameters, and the like.

As described above, by using the circuits illustrated in FIGS. 8A to 8D and the data processing device, calculation of the hierarchical neural network using supervised learning can be performed.

Note that the structures, methods, and the like described in this embodiment can be combined as appropriate with any of the structures, methods, and the like described in the other embodiments.

Embodiment 2

In this embodiment, a cross-sectional structure of a data processing device will be described. In this embodiment, a cross-sectional structure of a data processing device including the potential holding circuit shown in FIG. 3A is described.

Figure 9:
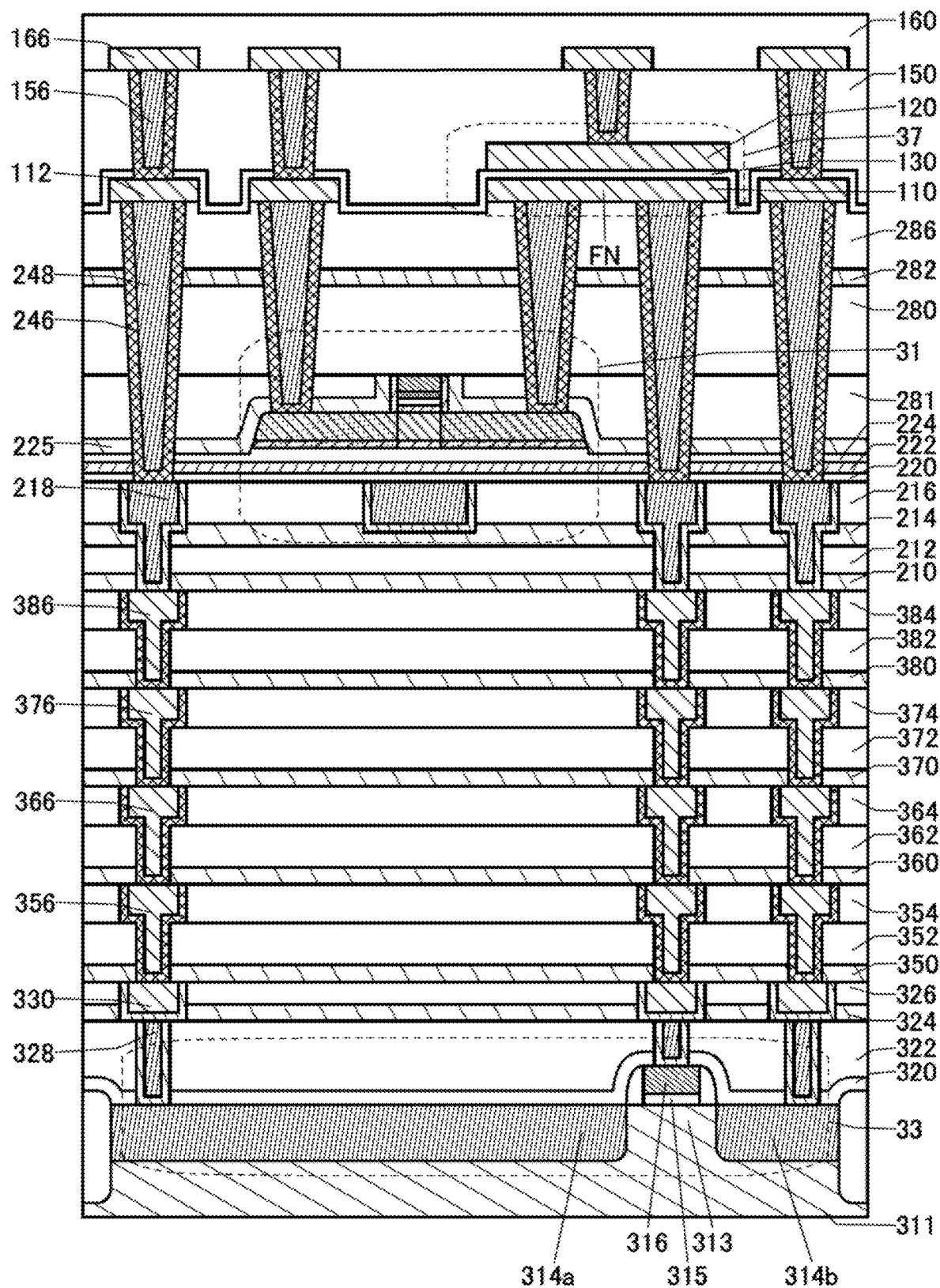
FIG. 9 is a cross-sectional view for describing one embodiment of the present invention.
Figure 11:
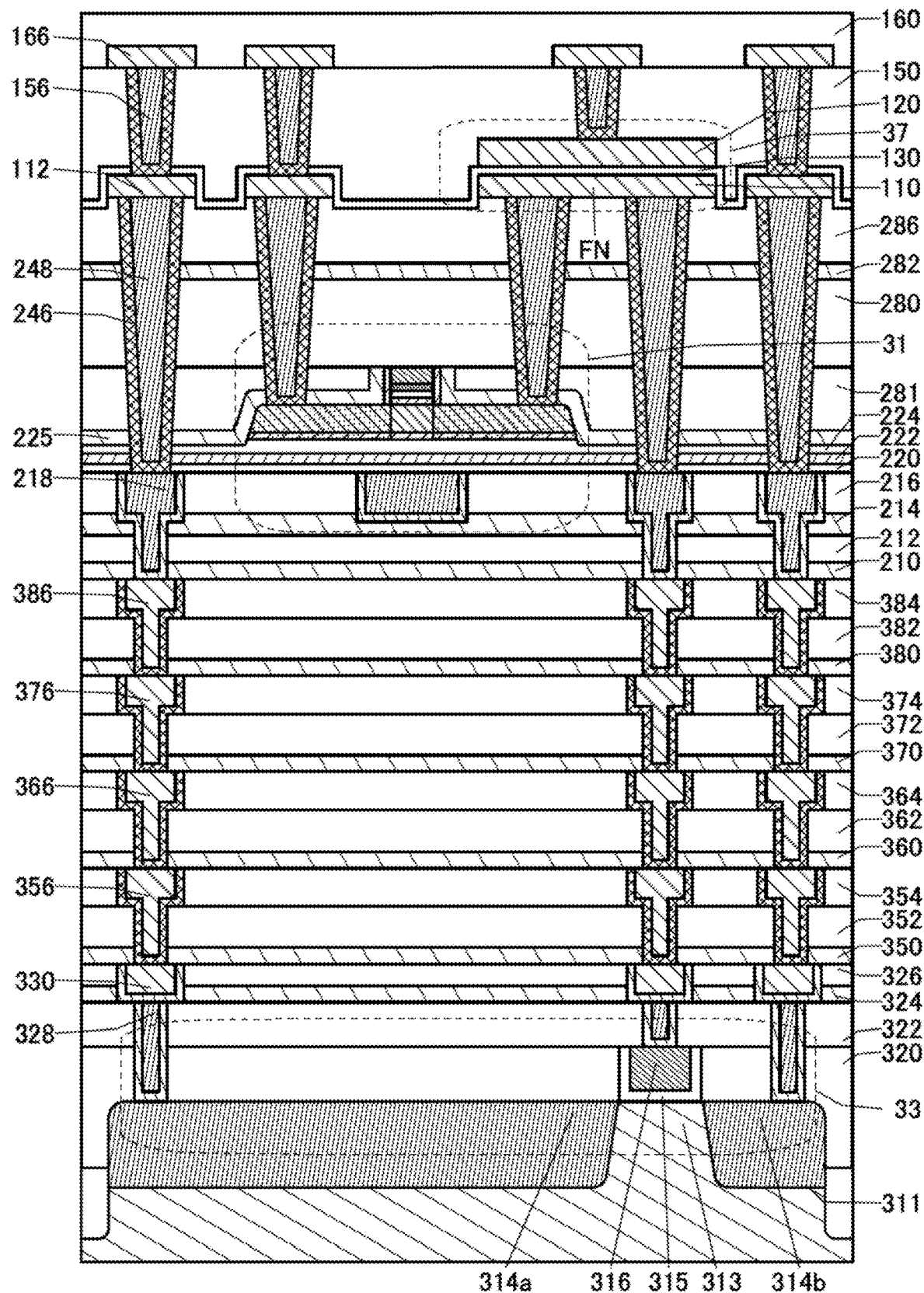
FIG. 11 is a cross-sectional view for describing one embodiment of the present invention.
Figure 12:
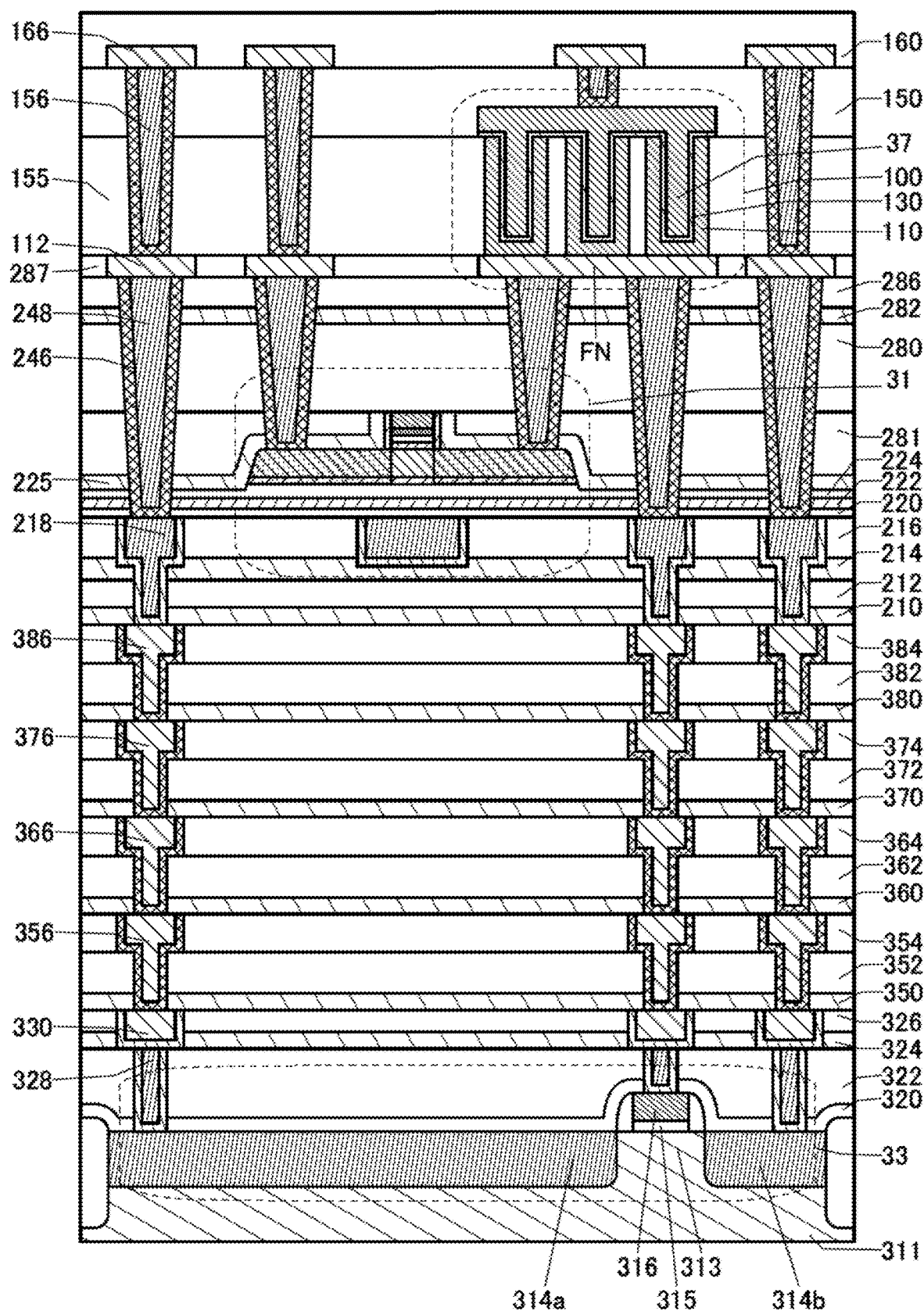
FIG. 12 is a cross-sectional view for describing one embodiment of the present invention.

As shown in FIG. 9, FIG. 11, and FIG. 12, the potential holding circuit 24 described in FIG. 3A includes the transistor 31, the transistor 33, and a capacitor 27.

[Cross-Sectional Structure 1]

In the cross-sectional structure shown in FIG. 9, the transistor 31 is provide over the transistor 33, and the capacitor 37 is provided over the transistor 33 and the transistor 31.

The transistor 31 is a transistor (OS transistor) in which a channel is formed in a semiconductor layer including an oxide semiconductor. Although the details of the transistor 31 are described later, with the OS transistor having the structure illustrated in FIG. 9, the transistor 31 can be formed with a high yield even when miniaturized. The data processing device including such an OS transistor can be miniaturized or highly integrated. Because the off-state current of the OS transistor is small, by using the OS transistor in a data processing device, stored data can be retained for a long time. In other words, such a data processing device does not require refresh operation or has an extremely low frequency of the refresh operation, which leads to a sufficient reduction in power consumption.

The transistor 33 is provided in and on a substrate 311 and includes a conductor 316, an insulator 315, a semiconductor region 313 that is a part of the substrate 311, and a low-resistance region 314a and a low-resistance region 314b functioning as a source region and a drain region.

The transistor 33 is either a p-channel transistor or an n-channel transistor.

It is preferable that a region of the semiconductor region 313 where a channel is formed, a region in the vicinity thereof, the low-resistance regions 314a and 314b functioning as the source and drain regions, and the like contain a semiconductor such as a silicon-based semiconductor, further preferably single crystal silicon. Alternatively, a material including germanium (Ge), silicon germanium (SiGe), gallium arsenide (GaAs), gallium aluminum arsenide (GaAlAs), or the like may be contained. Silicon whose effective mass is adjusted by applying stress to the crystal lattice and thereby changing the lattice spacing may be contained. Alternatively, the transistor 33 may be a high-electron-mobility transistor (HEMT) with GaAs and GaAlAs, or the like.

The low-resistance regions 314a and 314b contain an element which imparts n-type conductivity, such as arsenic or phosphorus, or an element which imparts p-type conductivity, such as boron, in addition to a semiconductor material used for the semiconductor region 313.

The conductor 316 functioning as a gate electrode can be formed using a semiconductor material such as silicon containing the element which imparts n-type conductivity, such as arsenic or phosphorus, or the element which imparts p-type conductivity, such as boron, or using a conductive material such as a metal material, an alloy material, or a metal oxide material.

Note that the work function of a conductor is determined by a material of the conductor, whereby the threshold voltage can be adjusted. Specifically, it is preferable to use titanium nitride, tantalum nitride, or the like for the conductor. Furthermore, in order to ensure the conductivity and embeddability, it is preferable to use a stacked layer of metal materials such as tungsten and aluminum for the conductor. It is particularly preferable to use tungsten in terms of heat resistance.

Note that the transistor 33 illustrated in FIG. 9 is only an example, and the structure of the transistor 33 is not limited thereto; a transistor appropriate for a circuit configuration or a driving method can be used.

An insulator 320, an insulator 322, an insulator 324, and an insulator 326 are stacked sequentially so as to cover the transistor 33.

The insulator 320, the insulator 322, the insulator 324, and the insulator 326 can be formed using, for example, silicon oxide, silicon oxynitride, silicon nitride oxide, silicon nitride, aluminum oxide, aluminum oxynitride, aluminum nitride oxide, or aluminum nitride.

The insulator 322 may function as a planarization film for eliminating a level difference caused by the transistor 33 or the like underlying the insulator 322. For example, the top surface of the insulator 322 may be planarized by planarization treatment using a chemical mechanical polishing (CMP) method or the like to increase the level of planarity.

The insulator 324 is preferably formed using a film having a barrier property that prevents hydrogen or impurities from the substrate 311, the transistor 33, or the like from diffusing to a region where the transistor 31 is formed.

As an example of the film having a barrier property against hydrogen, a silicon nitride film formed by a CVD method can be given. The diffusion of hydrogen to a semiconductor element including an oxide semiconductor, such as the transistor 31, degrades the characteristics of the semiconductor element in some cases. Therefore, a film that prevents hydrogen diffusion is preferably provided between the transistor 31 and the transistor 33. The film that prevents hydrogen diffusion is specifically a film from which hydrogen is less likely to be released.

The amount of released hydrogen can be measured by thermal desorption spectroscopy (TDS), for example. The amount of hydrogen released from the insulator 324 that is converted into hydrogen atoms per unit area of the insulator 324 is less than or equal to $10\times10^{15}$ atoms/cm$^2$, preferably less than or equal to $5\times10^{15}$ atoms/cm$^2$ in the TDS analysis in the range from 50° C. to 500° C., for example.

Note that the permittivity of the insulator 326 is preferably lower than that of the insulator 324. For example, the relative permittivity of the insulator 326 is preferably lower than 4, further preferably lower than 3. The relative permittivity of the insulator 326 is, for example, preferably 0.7 times or less that of the insulator 324, further preferably 0.6 times or less that of the insulator 324. In the case where a material with a low permittivity is used for an interlayer film, the parasitic capacitance between wirings can be reduced.

A conductor 328, a conductor 330, and the like that are electrically connected to the capacitor 37 or the transistor 31 are provided in the insulator 320, the insulator 322, the insulator 324, and the insulator 326. Note that the conductor 328 and the conductor 330 each function as a plug or a wiring. A plurality of conductors functioning as plugs or wirings are collectively denoted by the same reference numeral in some cases. Furthermore, in this specification and the like, a wiring and a plug electrically connected to the wiring may be a single component. That is, there are cases where part of a conductor serves as a wiring and part of a conductor serves as a plug.

As a material for each of plugs and wirings (e.g., the conductor 328 and the conductor 330), a conductive material such as a metal material, an alloy material, a metal nitride material, or a metal oxide material can be used in a single-layer structure or a stacked-layer structure. It is preferable to use a high-melting-point material that has both heat resistance and conductivity, such as tungsten or molybdenum, and it is particularly preferable to use tungsten. Alternatively, a low-resistance conductive material such as aluminum or copper is preferably used. The use of a low-resistance conductive material can reduce wiring resistance.

A wiring layer may be provided over the insulator 326 and the conductor 330. For example, in FIG. 9, an insulator 350, an insulator 352, and an insulator 354 are stacked sequentially. Furthermore, a conductor 356 is formed in the insulator 350, the insulator 352, and the insulator 354. The conductor 356 functions as a plug or a wiring. Note that the conductor 356 can be formed using a material similar to those used for forming the conductor 328 and the conductor 330.

Note that the insulator 350 is preferably formed using an insulator having a barrier property against hydrogen, as with the insulator 324, for example. Furthermore, the conductor 356 preferably contains a conductor having a barrier property against hydrogen. In particular, the conductor having a barrier property against hydrogen is formed in an opening of the insulator 350 having a barrier property against hydrogen. In such a structure, the transistor 33 and the transistor 31 can be separated by a barrier layer, so that the diffusion of hydrogen from the transistor 33 to the transistor 31 can be prevented.

Note that as the conductor having a barrier property against hydrogen, tantalum nitride is preferably used, for example. The use of a stack including tantalum nitride and tungsten having high conductivity can inhibit the diffusion of hydrogen from the transistor 33 while the conductivity of a wiring is ensured. In this case, a tantalum nitride layer having a barrier property against hydrogen is preferably in contact with the insulator 350 having a barrier property against hydrogen.

A wiring layer may be provided over the insulator 354 and the conductor 356. For example, in FIG. 9, an insulator 360, an insulator 362, and an insulator 364 are stacked sequentially. Furthermore, a conductor 366 is formed in the insulator 360, the insulator 362, and the insulator 364. The conductor 366 functions as a plug or a wiring. Note that the conductor 366 can be formed using a material similar to those used for forming the conductor 328 and the conductor 330.

Note that the insulator 360 is preferably formed using an insulator having a barrier property against hydrogen, as with the insulator 324, for example. Furthermore, the conductor 366 preferably contains a conductor having a barrier property against hydrogen. In particular, the conductor having a barrier property against hydrogen is formed in an opening of the insulator 360 having a barrier property against hydrogen. In such a structure, the transistor 33 and the transistor 31 can be separated by a barrier layer, so that the diffusion of hydrogen from the transistor 33 to the transistor 31 can be prevented.

A wiring layer may be provided over the insulator 364 and the conductor 366. For example, in FIG. 9, an insulator 370, an insulator 372, and an insulator 374 are stacked sequentially. Furthermore, a conductor 376 is formed in the insulator 370, the insulator 372, and the insulator 374. The conductor 376 functions as a plug or a wiring. Note that the conductor 376 can be formed using a material similar to those used for forming the conductor 328 and the conductor 330.

Note that the insulator 370 is preferably formed using an insulator having a barrier property against hydrogen, as with the insulator 324, for example. Furthermore, the conductor 376 preferably contains a conductor having a barrier property against hydrogen. In particular, the conductor having a barrier property against hydrogen is formed in an opening of the insulator 370 having a barrier property against hydrogen. In such a structure, the transistor 33 and the transistor 31 can be separated by a barrier layer, so that the diffusion of hydrogen from the transistor 33 to the transistor 31 can be prevented.

A wiring layer may be provided over the insulator 374 and the conductor 376. For example, in FIG. 9, an insulator 380, an insulator 382, and an insulator 384 are stacked sequentially. Furthermore, a conductor 386 is formed in the insulator 380, the insulator 382, and the insulator 384. The conductor 386 functions as a plug or a wiring. Note that the conductor 386 can be formed using a material similar to those used for forming the conductor 328 and the conductor 330.

Note that the insulator 380 is preferably formed using an insulator having a barrier property against hydrogen, as with the insulator 324, for example. Furthermore, the conductor 386 preferably contains a conductor having a barrier property against hydrogen. In particular, the conductor having a barrier property against hydrogen is formed in an opening of the insulator 380 having a barrier property against hydrogen. In such a structure, the transistor 33 and the transistor 31 can be separated by a barrier layer, so that the diffusion of hydrogen from the transistor 33 to the transistor 31 can be prevented.

The insulator 210, the insulator 212, the insulator 214, and the insulator 216 are stacked sequentially over the insulator 384. A material having a barrier property against oxygen or hydrogen is preferably used for any of the insulator 210, the insulator 212, the insulator 214, and the insulator 216.

Each of the insulators 210 and 214 is preferably formed using, for example, a film having a barrier property that prevents hydrogen or impurities from the substrate 311, a region where the transistor 33 is formed, or the like from diffusing to a region where the transistor 31 is formed. Therefore, each of the insulators 210 and 214 can be formed using a material similar to that used for forming the insulator 324.

As an example of the film having a barrier property against hydrogen, a silicon nitride film formed by a CVD method can be given. The diffusion of hydrogen to a semiconductor element including an oxide semiconductor, such as the transistor 31, degrades the characteristics of the semiconductor element in some cases. Therefore, a film that prevents hydrogen diffusion is preferably provided between the transistor 31 and the transistor 33. The film that prevents hydrogen diffusion is specifically a film from which hydrogen is less likely to be released.

For the film having a barrier property against hydrogen used for each of the insulators 210 and 214, for example, a metal oxide such as aluminum oxide, hafnium oxide, or tantalum oxide is preferably used.

In particular, aluminum oxide has an excellent blocking effect that prevents permeation of oxygen and impurities such as hydrogen and moisture which cause a change in electrical characteristics of the transistor. Accordingly, the use of aluminum oxide can prevent the entry of impurities such as hydrogen and moisture into the transistor 31 in and after a manufacturing process of the transistor. In addition, release of oxygen from the oxide contained in the transistor 31 can be prevented. Therefore, aluminum oxide is suitably used for a protective film of the transistor 31.

The insulators 212 and 216 can be formed using a material similar to that used for forming the insulator 320, for example. In the case where a material with a relatively low permittivity is used for an interlayer film, the parasitic capacitance between wirings can be reduced. For example, a silicon oxide film, a silicon oxynitride film, or the like can be used for the insulators 212 and 216.

A conductor 218, a conductor (the conductor 205) included in the transistor 31, and the like are provided in the insulators 210, 212, 214, and 216. Note that the conductor 218 functions as a plug or a wiring that is electrically connected to the capacitor 37 or the transistor 33. The conductor 218 can be formed using a material similar to those used for forming the conductors 328 and 330.

In particular, part of the conductor 218 that is in contact with the insulators 210 and 214 is preferably a conductor having a barrier property against oxygen, hydrogen, and water. In such a structure, the transistors 33 and 31 can be completely separated by the layer having a barrier property against oxygen, hydrogen, and water. As a result, the diffusion of hydrogen from the transistor 33 to the transistor 31 can be prevented.

The transistor 31 is provided over the insulator 214. Note that the transistor 31 in FIG. 9 is only an example and is not limited to the structure illustrated therein; an appropriate transistor may be used in accordance with a circuit configuration or a driving method.

The insulator 280 is provided over the transistor 31. In the insulator 280, an excess-oxygen region is preferably formed. In particular, in the case of using an oxide semiconductor in the transistor 31, when an insulator including an excess-oxygen region is provided in an interlayer film or the like in the vicinity of the transistor 31, oxygen vacancies in the oxide 230 included in the transistor 31 are reduced, whereby the reliability can be improved. The insulator 280 that covers the transistor 31 may function as a planarization film that covers a roughness thereunder. Note that the insulator 280 is provided to be in contact with an insulator 281 and an insulator 225 that are formed over the transistor 31.

As the insulator including the excess-oxygen region, specifically, an oxide material that releases part of oxygen by heating is preferably used. Oxide that releases part of oxygen by heating is an oxide film of which the amount of released oxygen converted into oxygen atoms is greater than or equal to $1.0 \times 10^{18}$ atoms/cm$^3$, preferably greater than or equal to $3.0 \times 10^{20}$ atoms/cm$^3$ in TDS analysis. Note that the temperature of the film surface in the TDS analysis is preferably higher than or equal to 100° C. and lower than or equal to 700° C., or higher than or equal to 100° C. and lower than or equal to 500° C.

For example, as such a material, a material containing silicon oxide or silicon oxynitride is preferably used. Alternatively, a metal oxide can be used. Note that in this specification, "silicon oxynitride" refers to a material that contains oxygen at a higher proportion than nitrogen, and "silicon nitride oxide" refers to a material that contains nitrogen at a higher proportion than oxygen.

An insulator 282 is provided over the insulator 280. A material having a barrier property against oxygen or hydrogen is preferably used for the insulator 282. Thus, the insulator 282 can be formed using a material similar to that used for forming the insulator 214. For the insulator 282, a metal oxide such as aluminum oxide, hafnium oxide, or tantalum oxide is preferably used, for example.

In particular, aluminum oxide has an excellent blocking effect that prevents permeation of oxygen and impurities such as hydrogen and moisture which cause a change in electrical characteristics of the transistor. Accordingly, the use of aluminum oxide can prevent the entry of impurities such as hydrogen and moisture into the transistor 31 in and after a manufacturing process of the transistor. In addition, release of oxygen from the oxide contained in the transistor 31 can be prevented. Therefore, aluminum oxide is suitably used for a protective film of the transistor 31.

An insulator 286 is provided over the insulator 282. The insulator 286 can be formed using a material similar to that used for forming the insulator 320. In the case where a material with a relatively low permittivity is used for an interlayer film, the parasitic capacitance between wirings can be reduced. For example, a silicon oxide film, a silicon oxynitride film, or the like can be used for the insulator 286.

A conductor 246, a conductor 248, and the like are provided in the insulators 220, 222, 224, 280, 282, and 286.

The conductors 246 and 248 function as plugs or wirings that are electrically connected to the capacitor 37, the transistor 31, or the transistor 33. The conductors 246 and 248 can be formed using a material similar to those used for forming the conductors 328 and 330.

The capacitor 37 is provided above the transistor 31. The capacitor 37 includes a conductor 110, a conductor 120, and an insulator 130.

A conductor 112 may be provided over the conductors 246 and 248. The conductor 112 functions as a plug or a wiring that is electrically connected to the capacitor 37, the transistor 31, or the transistor 33. The conductor 110 functions as the electrode of the capacitor 37. The conductor 112 and the conductor 110 can be formed at the same time.

The conductor 112 and the conductor 110 can be formed using a metal film containing an element selected from molybdenum, titanium, tantalum, tungsten, aluminum, copper, chromium, neodymium, and scandium; a metal nitride film containing any of the above elements as its component (a tantalum nitride film, a titanium nitride film, a molybdenum nitride film, or a tungsten nitride film); or the like. Alternatively, it is possible to use a conductive material such as an indium tin oxide, an indium oxide containing tungsten oxide, an indium zinc oxide containing tungsten oxide, an indium oxide containing titanium oxide, an indium tin oxide containing titanium oxide, an indium zinc oxide, or an indium tin oxide to which silicon oxide is added.

The conductor 112 and the conductor 110 each have a single-layer structure in FIG. 9; however, one embodiment of the present invention is not limited thereto, and a stacked-layer structure of two or more layers may be used. For example, between a conductor having a barrier property and a conductor having high conductivity, a conductor which is highly adhesive to the conductor having a barrier property and the conductor having high conductivity may be formed.

As a dielectric of the capacitor 37, the insulator 130 is provided over the conductors 112 and 110. The insulator 130 can be formed to have a single-layer structure or a stacked-layer structure using, for example, silicon oxide, silicon oxynitride, silicon nitride oxide, silicon nitride, aluminum oxide, aluminum oxynitride, aluminum nitride oxide, aluminum nitride, hafnium oxide, hafnium oxynitride, hafnium nitride oxide, hafnium nitride, or the like.

A material with high dielectric strength, such as silicon oxynitride, is preferably used for the insulator 130, for example. In the capacitor 37 such a structure, the dielectric strength can be increased and the electrostatic breakdown of the capacitor 37 can be prevented because of the insulator 130.

Over the insulator 130, the conductor 120 is provided so as to overlap with the conductor 110. Note that the conductor 120 can be formed using a conductive material such as a metal material, an alloy material, or a metal oxide material. It is preferable to use a high-melting-point material which has both heat resistance and conductivity, such as tungsten or molybdenum, and it is particularly preferable to use tungsten. In the case where the conductor 120 is formed concurrently with another component such as a conductor, copper (Cu), aluminum (Al), or the like which is a low-resistance metal material can be used.

An insulator 150 is provided over the conductor 120 and the insulator 130. The insulator 150 can be formed using a material similar to that used for forming the insulator 320. The insulator 150 may function as a planarization film that covers a roughness thereunder.

The above is the description of the structure example. With the use of the structure, a change in electrical characteristics can be suppressed and reliability can be improved in a data processing device including a transistor including an oxide semiconductor. The power consumption of a data processing device including a transistor including an oxide semiconductor can be reduced. Miniaturization or high integration of a data processing device including a transistor including an oxide semiconductor can be achieved. A miniaturized or highly integrated data processing device can be provided with high yield.

<Transistor 31>

An example of the OS transistor that can be used as the aforementioned transistor 31 will be described.

Figure 10A:
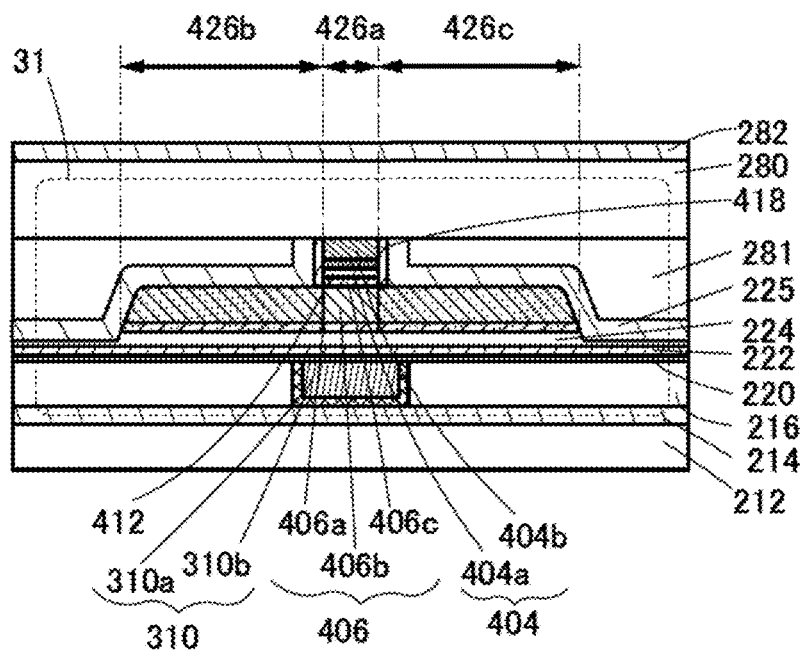
FIGS. 10A and 10B are cross-sectional views for describing one embodiment of the present invention.

FIG. 10A is a cross-sectional view of the transistor 31, which corresponds to a cross-sectional view in the channel width direction of the transistor 31.

As illustrated in FIG. 10A, the transistor 31 includes the insulator 224 over the insulator 212; an oxide 406a over the insulator 224; an oxide 406b in contact with at least part of the top surface of the oxide 406a; an oxide 406c in contact with at least part of the top surface of the oxide 406b; an insulator 412 over the oxide 406c; a conductor 404a over the insulator 412; a conductor 404b over the conductor 404a; a sidewall insulator 418 in contact with side surfaces of the insulator 412, the conductor 404a, and the conductor 404b; and an insulator 225 that is in contact with top and side surfaces of the oxide 406b, a side surface of the oxide 406c, and a side surface of the sidewall insulator 418.

Hereinafter, the oxides 406a, 406b and 406c are collectively referred to as an oxide 406 in some cases. The conductors 404a and 404b are collectively referred to as a conductor 404 in some cases. The conductors 310a and 310b are collectively referred to as a conductor 310 in some cases.

The transistor 31 may include the insulator 216 over the insulator 401, and the conductor 310 embedded in the insulator 216.

In the conductor 310, the conductor 310a is formed in contact with an inner wall of an opening in the insulator 216, and the conductor 310b is formed on the inner side. The top surfaces of the conductors 310a and 310b can have substantially the same level as the top surface of the insulator 216.

The conductor 404 can serve as a top gate, and the conductor 310 can serve as a back gate. The potential of the back gate may be the same as that of the top gate, or may be the ground potential or a given potential. By changing the potential of the back gate independently of the potential of the top gate, the threshold voltage of the transistor can be changed.

The conductor 310a is preferably formed using a conductive material having a function of inhibiting the penetration of impurities such as water and hydrogen (a conductive material that is unlikely to transmit impurities such as water and hydrogen). The conductor 310a is a single layer or a stacked layer, preferably formed using tantalum, tantalum nitride, ruthenium, ruthenium oxide, or the like. Accordingly, diffusion of impurities such as water and hydrogen from a layer under the insulator 214 into an upper layer through the conductor 310 can be inhibited.

The conductor 310b is preferably formed using a conductive material containing tungsten, copper, or aluminum as its main component. Although not illustrated, the conductor 310b may have a stacked-layer structure. For example, titanium, titanium nitride, and the above conductive material may be stacked as the conductor 310b.

The insulator 214 can serve as a barrier insulating film for preventing impurities such as water and hydrogen from entering the transistor from a lower layer. The insulator 214 is preferably formed using an insulating material that has a function of inhibiting the penetration of impurities such as water and hydrogen, and is preferably formed using aluminum oxide or the like, for example. Accordingly, impurities such as water and hydrogen can be prevented from diffusing into layers over the insulator 214.

Furthermore, the insulator 214 is preferably formed using an insulating material that has a function of inhibiting the penetration of oxygen (e.g., an oxygen atom or an oxygen molecule). Thus, oxygen contained in the insulator 224 or the like can be prevented from being diffused to lower layers.

The insulator 222 is preferably formed using an insulating material that has a function of inhibiting the penetration of oxygen and impurities such as water and hydrogen, and is preferably formed using aluminum oxide or hafnium oxide, for example. Accordingly, diffusion of impurities such as water and hydrogen from a layer under the insulator 222 into a layer over the insulator 222 can be inhibited. Furthermore, oxygen contained in the insulator 224 or the like can be prevented from being diffused to lower layers.

Furthermore, the concentration of impurities such as water, hydrogen, and nitrogen oxide in the insulator 224 is preferably lowered. The amount of hydrogen released from the insulator 224 that is converted into hydrogen molecules per unit area of the insulator 224 is less than or equal to $2\times10^{15}$ molecules/cm$^2$, preferably less than or equal to $1\times10^{15}$ molecules/cm$^2$, and further preferably less than or equal to $5\times10^{14}$ molecules/cm$^2$ in thermal desorption spectroscopy (TDS) analysis in the range of 50° C. to 500° C., for example. The insulator 224 is preferably formed using an insulator from which oxygen is released by heating.

The insulator 412 can serve as a first gate insulating film. The insulators 220, 222, and 224 can serve as second gate insulating films.

Figure 10B:
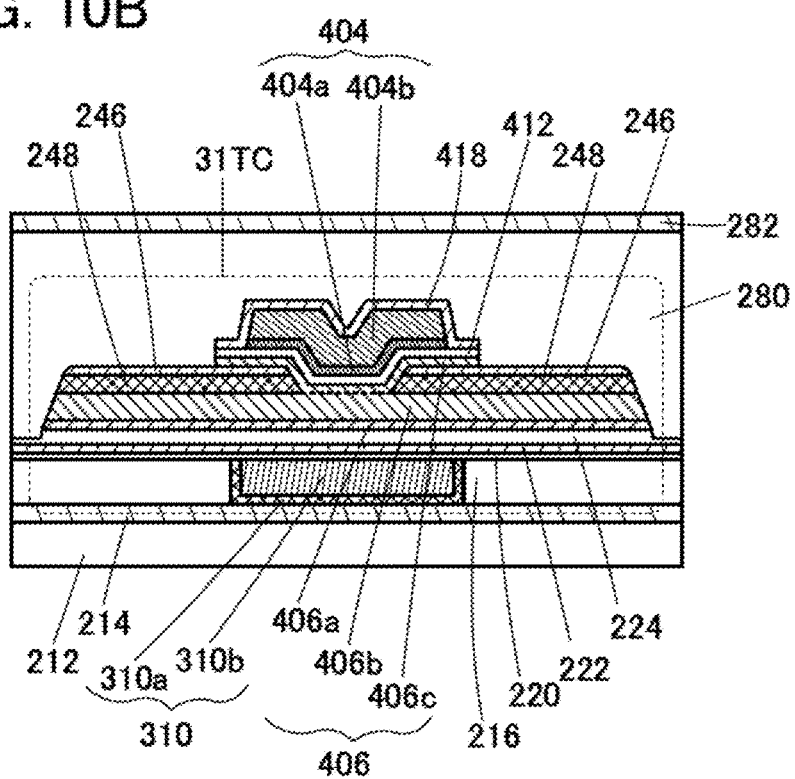

FIG. 10B illustrates a cross-sectional view of a transistor 31TC, which has a structure different from that illustrated in FIG. 10A. FIG. 10B corresponds to, like FIG. 10A, a cross-sectional view in the channel width direction of the transistor 31.

The oxide 406 is preferably formed using a metal oxide functioning as an oxide semiconductor (hereinafter, the metal oxide is also referred to as an oxide semiconductor). The metal oxide preferably has an energy gap of 2 eV or more, preferably 2.5 eV or more. With the use of a metal oxide having such a wide energy gap, the off-state current of the transistor can be reduced.

A transistor formed using an oxide semiconductor has an extremely low leakage current in an off state; thus, a semiconductor device with low power consumption can be provided. An oxide semiconductor can be formed by a sputtering method or the like and thus can be used in a transistor included in a highly integrated semiconductor device.

An oxide semiconductor preferably contains at least indium or zinc. In particular, indium and zinc are preferably contained. In addition, aluminum, gallium, yttrium, tin, or the like is preferably contained. Furthermore, one or more elements selected from boron, silicon, titanium, iron, nickel, germanium, zirconium, molybdenum, lanthanum, cerium, neodymium, hafnium, tantalum, tungsten, magnesium, and the like may be contained.

Here, the case where an oxide semiconductor is In-M-Zn oxide containing indium, an element M, and zinc is considered. The element M is aluminum, gallium, yttrium, tin, or the like. Alternatively, the element M can be boron, silicon, titanium, iron, nickel, germanium, zirconium, molybdenum, lanthanum, cerium, neodymium, hafnium, tantalum, tungsten, magnesium, or the like. Note that two or more of the above elements may be used in combination as the element M.

In this specification and the like, a metal oxide including nitrogen is also called a metal oxide in some cases. Moreover, a metal oxide including nitrogen may be called a metal oxynitride.

Here, the atomic ratio of the element M to the constituent elements in the metal oxide used as the oxide 406a is preferably greater than that in the metal oxide used as the oxide 406b. Moreover, the atomic ratio of the element M to In in the metal oxide used as the oxide 406a is preferably greater than that in the metal oxide used as the oxide 406b.

When using the above metal oxide as the oxide 406a, it is preferable that the conduction band minimum of the oxide 406a be higher than the conduction band minimum of the region of the oxide 406b where the conduction band minimum is low. In other words, the electron affinity of the oxide 406a is preferably smaller than the electron affinity of the region of the oxide 406b where the conduction band minimum is low.

Here, the energy level of the conduction band minimum is gradually varied in the oxides 406a and 406b. In other words, the energy level of the conduction band minimum is continuously varied or continuously connected. To vary the energy level gradually, the density of defect states in a mixed layer formed at the interface between the oxides 406a and 406b is decreased.

Specifically, when the oxides 406a and 406b contain the same element (as a main component) in addition to oxygen, a mixed layer with a low density of defect states can be formed. For example, in the case where the oxide 406b is an In—Ga—Zn oxide, it is preferable to use an In—Ga—Zn oxide, a Ga—Zn oxide, gallium oxide, or the like as the oxide 406a.

At this time, a narrow-gap portion formed in the oxide 406b serves as a main carrier path. Since the density of defect states at the interface between the oxides 406a and 406b can be decreased, the influence of interface scattering on carrier conduction is small, and a high on-state current can be obtained.

The oxide 406 includes a region 426a, a region 426b, and a region 426c. As illustrated in FIG. 10A, the region 426a is sandwiched between the region 426b and the region 426c. The regions 426b and 426c are reduced in resistance through the formation of the insulator 225, and have higher conductivity than the region 426a. Impurity elements such as hydrogen and nitrogen, which are contained in an atmosphere where the insulator 225 is formed, are added to the regions 426b and 426c. Thus, owing to the added impurity element, oxygen vacancies are generated mainly in the regions of the oxide 406b that overlap with the insulator 225, and furthermore the impurity element enters the oxygen vacancies, which increases the carrier density and decreases the resistance.

Therefore, the concentration of at least one of hydrogen and nitrogen is preferably higher in the regions 426b and 426c than in the region 426a. The concentration of hydrogen or nitrogen can be measured by secondary ion mass spectrometry (SIMS) or the like.

Note that the resistance of the regions 426b and 426c is reduced by the addition of an element that generates oxygen vacancies or an element that is bonded to oxygen vacancies. Typical examples of the element are hydrogen, boron, carbon, nitrogen, fluorine, phosphorus, sulfur, chlorine, titanium, and a rare gas element. Typical examples of the rare gas element are helium, neon, argon, krypton, and xenon. Thus, the regions 426b and 426c include one or more of the above-described elements.

The regions 426b and 426c are formed in at least the regions of the oxide 406 that overlap with the insulator 225. Here, one of the region 426b and the region 426c in the oxide 406b can function as a source region, and the other can function as a drain region. Moreover, the region 426a in the oxide 406b can function as a channel formation region.

The insulator 412 is preferably provided in contact with the top surface of the oxide 406b. The insulator 412 is preferably formed using an insulator from which oxygen is released by heating. When the insulator 412 formed using such a material is provided in contact with the top surface of the oxide 406b, oxygen can be supplied to the oxide 406b effectively. Furthermore, the concentration of impurities such as water and hydrogen in the insulator 412 is preferably lowered as in the insulator 224. The thickness of the insulator 412 is preferably more than or equal to 1 nm and less than or equal to 20 nm, and may be approximately 10 nm, for example.

The insulator 412 preferably contains oxygen. The amount of oxygen released from the insulator 412, which is converted into oxygen molecules per unit area of the insulator 412, is more than or equal to $1\times10^{14}$ molecules/cm$^2$, preferably more than or equal to $2\times10^{14}$ molecules/cm$^2$, further preferably more than or equal to $4\times10^{14}$ molecules/cm$^2$ in thermal desorption spectroscopy (TDS) in the range of the surface temperatures from 100° C. to 700° C. or from 100° C. to 500° C., for example.

The insulator 412 and the conductor 404 each include a region that overlaps with the oxide 406b. In addition, it is preferable that side surfaces of the insulator 412, the conductor 404a, and the conductor 404b be substantially aligned with each other.

The conductor 404a is preferably formed using a conductive oxide. For example, the metal oxide that can be used as the oxide 406a to the oxide 406c can be used for the conductor 404a. In particular, an In—Ga—Zn-based oxide with an atomic ratio [In]:[Ga]:[Zn]=4:2:3 to 4.1 or in the neighborhood thereof, which has high conductivity, is preferably used. When the conductor 404a is formed using such a material, oxygen can be prevented from entering the conductor 404b, and an increase in the electric resistance value of the conductor 404c due to oxidation can be prevented.

In addition, by depositing such a conductive oxide by sputtering, oxygen can be added to the insulator 412, which makes it possible to supply oxygen to the oxide 406b. Thus, oxygen vacancies in the region 426a of the oxide 406 can be reduced.

The conductor 404b can be formed using a metal such as tungsten, for example. It is also possible to use, as the conductor 404b, a conductor that can add impurities such as nitrogen to the conductor 404a to improve the conductivity of the conductor 404a. For example, titanium nitride is preferably used for the conductor 404b. Alternatively, the conductor 404b may be a stack including a metal nitride such as titanium nitride and a metal such as tungsten thereover.

The oxide 406 is preferably formed using a metal oxide functioning as an oxide semiconductor (hereinafter, the metal oxide is also referred to as an oxide semiconductor).

An oxide semiconductor preferably contains at least indium or zinc. In particular, indium and zinc are preferably contained. In addition, aluminum, gallium, yttrium, tin, or the like is preferably contained. Furthermore, one or more elements selected from boron, silicon, titanium, iron, nickel, germanium, zirconium, molybdenum, lanthanum, cerium, neodymium, hafnium, tantalum, tungsten, magnesium, or the like may be contained.

Here, the case where an oxide semiconductor is InMZnO containing indium, an element M, and zinc is considered. Note that the element M is aluminum, gallium, yttrium, tin, or the like. Other elements that can be used as the element M include boron, silicon, titanium, iron, nickel, germanium, zirconium, molybdenum, lanthanum, cerium, neodymium, hafnium, tantalum, tungsten, and magnesium. Note that two or more of the above elements may be used in combination as the element M.

Note that in this specification and the like, a metal oxide including nitrogen is also called a metal oxide in some cases. Moreover, a metal oxide including nitrogen may be called a metal oxynitride.

<Modification Example 1 of Cross-Sectional Structure 1>

FIG. 11 illustrates a modification example of this embodiment. FIG. 11 is different from FIG. 9 in the structure of the transistor 33.

In the transistor 33 illustrated in FIG. 11, the semiconductor region 313 (part of the substrate 311) in which the channel is formed has a protruding portion. Furthermore, the conductor 316 is provided to cover the top and side surfaces of the semiconductor region 313 with the insulator 315 positioned therebetween. Note that the conductor 316 may be formed using a material for adjusting the work function. The transistor 33 having such a structure is also referred to as a FIN transistor because the protruding portion of the semiconductor substrate is utilized. An insulator serving as a mask for forming the protruding portion may be provided in contact with the top surface of the protruding portion. Although the case where the protruding portion is formed by processing part of the semiconductor substrate is described here, a semiconductor film having a protruding shape may be formed by processing an SOI substrate.

The above is the description of the modification example. With the use of the structure, a change in electrical characteristics can be prevented and reliability can be improved in a data processing device using a transistor including an oxide semiconductor. The power consumption of a data processing device using a transistor including an oxide semiconductor can be reduced. A data processing device using a transistor including an oxide semiconductor can be miniaturized or highly integrated. A miniaturized or highly integrated data processing device can be provided with a high yield.

<Modification Example 2 of Cross-Sectional Structure 1>

FIG. 12 illustrates another modification example of this embodiment. FIG. 12 is different from FIG. 9 in the structure of the capacitor 37.

In a data processing device illustrated in FIG. 12, an insulator 287 is provided over the insulator 286, the conductor 112 is embedded in the insulator 287, an insulator 155 is provided over the insulator 287, the conductors 110 are provided in a plurality of openings formed in the insulator 155, the insulator 130 is provided over the conductors 110, and the conductor 120 is provided over the insulator 130 so as to overlap with the conductors 110. The conductor 112 is provided to connect the conductor 248 electrically connected to the transistor 31 and the conductor 248 electrically connected to the transistor 33, and the conductors 110 are provided in contact with the conductor 112. The insulator 287 and the insulator 155 can be formed using a material similar to that of the insulator 320.

In the capacitor 37 illustrated in FIG. 12, the conductors 110, the insulator 130, and the conductor 120 overlap with each other in the openings formed in the insulator 155; thus, the conductors 110, the insulator 130, and the conductor 120 preferably have favorable coverage. For this reason, the conductors 110, the insulator 130, and the conductor 120 are preferably formed by a method with which a film having favorable step coverage can be formed, such as a CVD method or an ALD method.

Because the capacitor 37 is formed along the shapes of the openings formed in the insulator 155, the capacitance can be larger as the openings become deeper. Furthermore, the capacitance can be larger as the number of the openings becomes larger. With the capacitor 37 having such a structure, the capacitance can be increased without increasing the area of the top surface of the capacitor 37.

The above is the description of the modification example. With the use of the structure, a change in electrical characteristics can be prevented and reliability can be improved in a data processing device using a transistor including an oxide semiconductor. The power consumption of a data processing device using a transistor including an oxide semiconductor can be reduced. A data processing device using a transistor including an oxide semiconductor can be miniaturized or highly integrated. A miniaturized or highly integrated data processing device can be provided with a high yield.

The structures, methods, and the like described in this embodiment can be combined as appropriate with any of the structures, methods, and the like described in the other embodiments.

Embodiment 3

In this embodiment, one embodiment of a data processing device will be described with reference to FIGS. 13A and 13B, FIGS. 14A and 14B, and FIGS. 15A to 15F.
<Semiconductor Wafer and Chip>

Figure 13A:
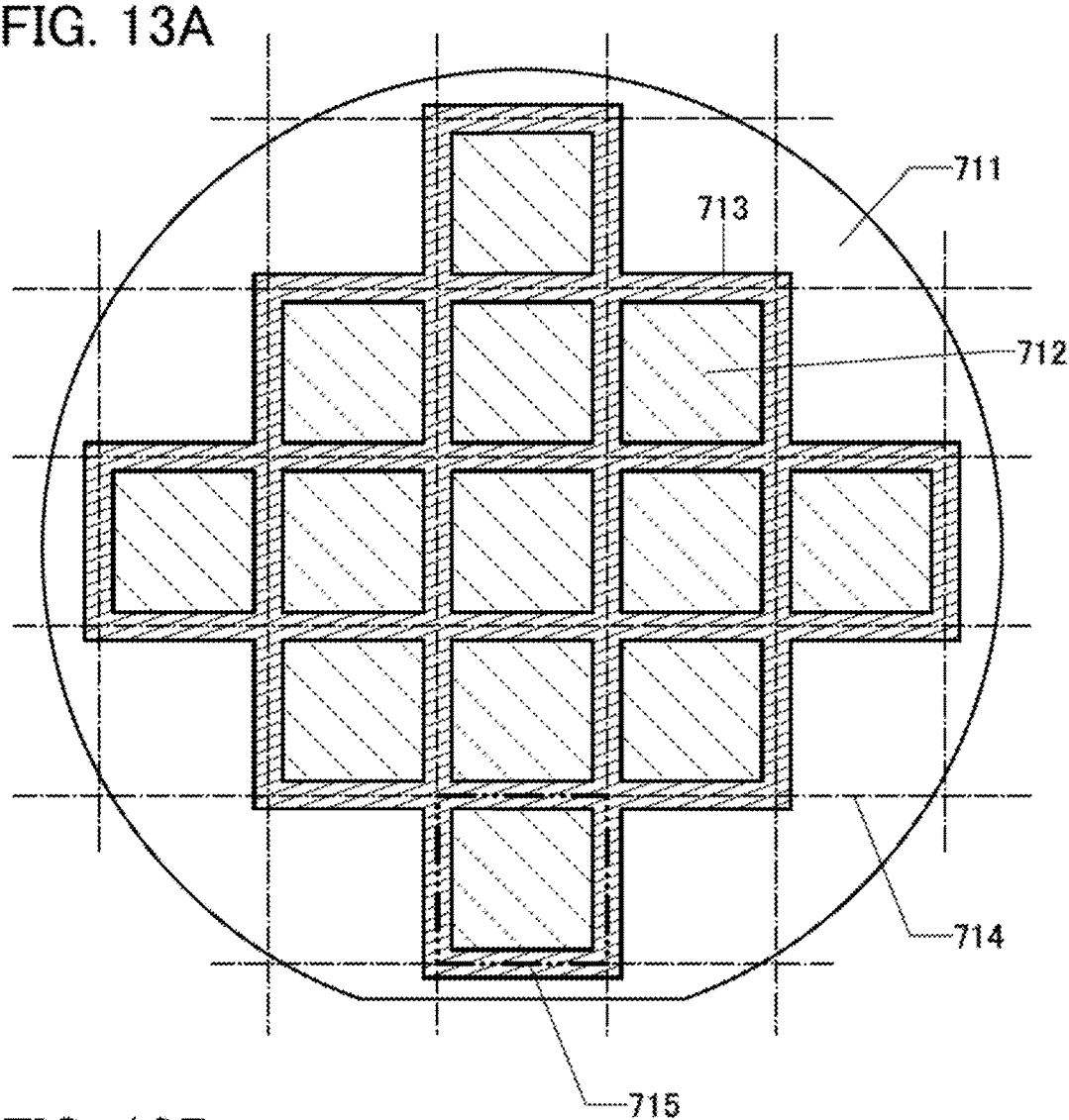
FIGS. 13A and 13B are top views of a semiconductor wafer of one embodiment of the present invention.

FIG. 13A is a top view of a substrate 711 before dicing treatment. As the substrate 711, a semiconductor substrate (also referred to as a "semiconductor wafer") can be used, for example. A plurality of circuit regions 712 are provided over the substrate 711. A data processing device of one embodiment of the present invention or the like can be provided in the circuit region 712.

Figure 13B:
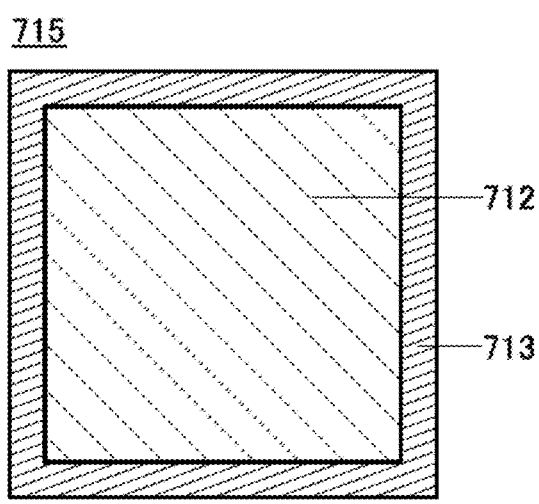

Each of the circuit regions 712 is surrounded by a separation region 713. Separation lines (also referred to as "dicing lines") 714 are set at a position overlapping with the separation regions 713. The substrate 711 can be cut along the separation lines 714 into chips 715 including the circuit regions 712. FIG. 13B is an enlarged view of the chip 715.

A conductive layer, a semiconductor layer, or the like may be provided in the separation regions 713. Providing a conductive layer, a semiconductor layer, or the like in the separation regions 713 relieves ESD that might be caused in a dicing step, preventing a decrease in the yield of the dicing step. A dicing step is generally performed while pure water whose specific resistance is decreased by dissolution of a carbonic acid gas or the like is supplied to a cut portion, in order to cool down the substrate, remove swarf, and prevent electrification, for example. Providing a conductive layer, a semiconductor layer, or the like in the separation regions 713 allows a reduction in the usage of the pure water. Thus, the cost of manufacturing data processing devices can be reduced. In addition, data processing devices can be manufactured with improved productivity.
<Electronic Component>

An example of an electronic component using the chip 715 will be described with reference to FIGS. 14A and 14B and FIGS. 15A to 15E. Note that an electronic component is also referred to as a semiconductor package or an IC package. For electronic components, there are various standards, names, and the like depending on the direction in which terminals are extracted, the shapes of terminals, and the like.

The electronic component is completed when the data processing device described in any of the above embodiments is combined with components other than the data processing device in an assembly process (post-process).

Figure 14A:
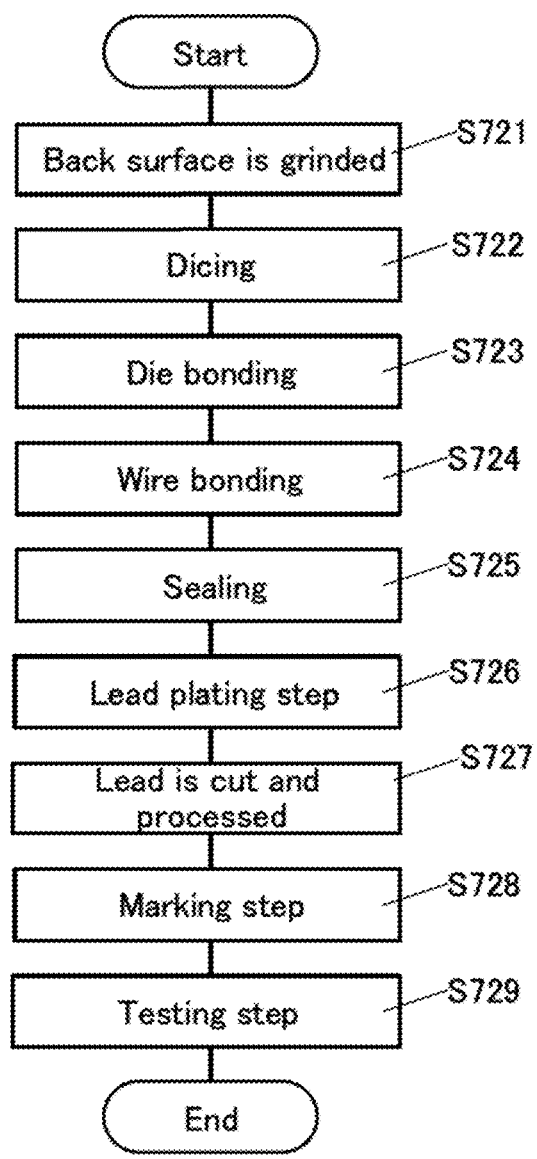
FIGS. 14A and 14B are a flowchart describing a manufacturing process example of an electronic component, and a schematic perspective view of the electronic component.

The post-process is described with reference to a flow chart in FIG. 14A. After the data processing device of one embodiment of the present invention and the like are formed over the substrate 711 in a pre-process, a back surface grinding step in which the back surface (the surface where a data processing device and the like are not formed) of the substrate 711 is ground is performed (Step S721). When the substrate 711 is thinned by grinding, the size of the electronic component can be reduced.

Next, the substrate 711 is divided into a plurality of chips 715 in a dicing step (Step S722). Then, the divided chips 715 are individually bonded to a lead frame in a die bonding step (Step S723). To bond the chip 715 and a lead frame in the die bonding step, a method such as resin bonding or tape-automated bonding is selected as appropriate depending on products. Note that the chip 715 may be bonded to an interposer substrate instead of the lead frame.

Next, a wire bonding step for electrically connecting a lead of the lead frame and an electrode on the chip 715 through a metal wire is performed (Step S724). As the metal wire, a silver wire, a gold wire, or the like can be used. Ball bonding or wedge bonding can be used as the wire bonding.

The wire-bonded chip 715 is subjected to a sealing step (molding step) of sealing the chip with an epoxy resin or the like (Step S725). Through the sealing step, the inside of the electronic component is filled with a resin, so that a wire for connecting the chip 715 to the lead can be protected from external mechanical force, and deterioration of characteristics (decrease in reliability) due to moisture or dust can be reduced.

Subsequently, the lead of the lead frame is plated in a lead plating step (Step S726). Through the plating process, corrosion of the lead can be prevented, and soldering for mounting the electronic component on a printed circuit board in a later step can be performed with higher reliability. Then, the lead is cut and processed in a formation step (Step S727).

Next, a printing (marking) step is performed on a surface of the package (Step S728). After a testing step (Step S729) for checking whether an external shape is good and whether there is malfunction, for example, the electronic component is completed.

Figure 14B:
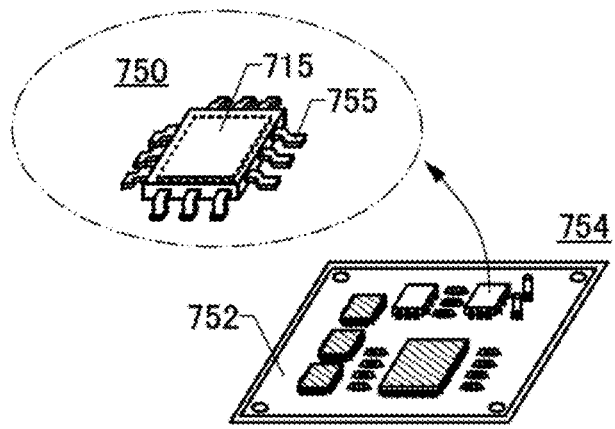

FIG. 14B is a perspective schematic diagram of a completed electronic component. FIG. 14B illustrates a perspective schematic diagram of a quad flat package (QFP) as an example of an electronic component. An electronic component 750 in FIG. 14B includes a lead 755 and the chip 715. The electronic component 750 may include multiple chips 715.

The electronic component 750 in FIG. 14B is mounted on a printed circuit board 752, for example. A plurality of electronic components 750 are combined and electrically connected to each other over the printed circuit board 752; thus, a circuit board on which the electronic components are mounted (a circuit board 754) is completed. The completed circuit board 754 is provided in an electronic device or the like.

Note that this embodiment can be combined with any of the other embodiments in this specification.

Embodiment 4

<Electronic Device>

An electronic component including a data processing device of one embodiment of the present invention can be used for a variety of electronic devices. FIGS. 15A to 15F each illustrate a specific example of an electronic device including the electronic component of one embodiment of the present invention.

Figure 15A:
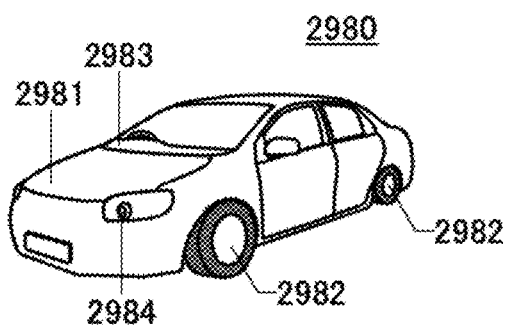
FIGS. 15A to 15F are diagrams each illustrating an electronic device of one embodiment of the present invention.

FIG. 15A is an external view illustrating an example of a car. An automobile 2980 includes a car body 2981, wheels 2982, a dashboard 2983, lights 2984, and the like. The automobile 2980 also includes an antenna, a battery, and the like.

Figure 15B:
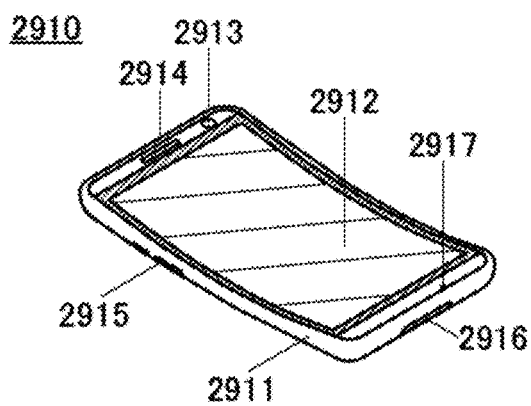

An information terminal 2910 illustrated in FIG. 15B includes a housing 2911, a display portion 2912, a microphone 2917, a speaker portion 2914, a camera 2913, an external connection portion 2916, an operation switch 2915, and the like. A display panel and a touch screen that use a flexible substrate are provided in the display portion 2912. The information terminal 2910 also includes an antenna, a battery, and the like inside the housing 2911. The information terminal 2910 can be used as, for example, a smartphone, a mobile phone, a tablet information terminal, a tablet personal computer, or an e-book reader.

Figure 15C:
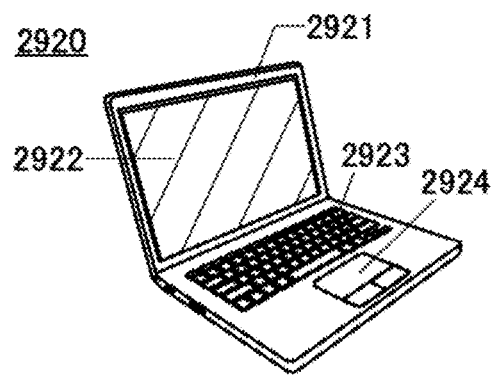

A notebook personal computer 2920 illustrated in FIG. 15C includes a housing 2921, a display portion 2922, a keyboard 2923, a pointing device 2924, and the like. The notebook personal computer 2920 also includes an antenna, a battery, and the like inside the housing 2921.

Figure 15D:
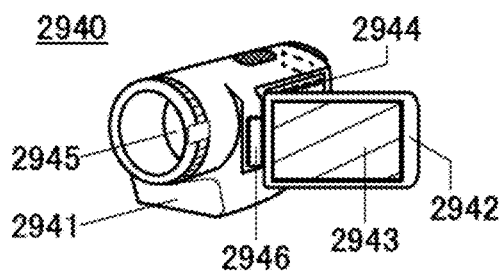

A video camera 2940 illustrated in FIG. 15D includes a housing 2941, a housing 2942, a display portion 2943, operation switches 2944, a lens 2945, a joint 2946, and the like. The operation switches 2944 and the lens 2945 are provided on the housing 2941, and the display portion 2943 is provided on the housing 2942. The video camera 2940 also includes an antenna, a battery, and the like inside the housing 2941. The housing 2941 and the housing 2942 are connected to each other with the joint 2946, and the angle between the housing 2941 and the housing 2942 can be changed with the joint 2946. By changing the angle between the housings 2941 and 2942, the orientation of an image displayed on the display portion 2943 can be changed or display and non-display of an image can be switched.

Figure 15E:
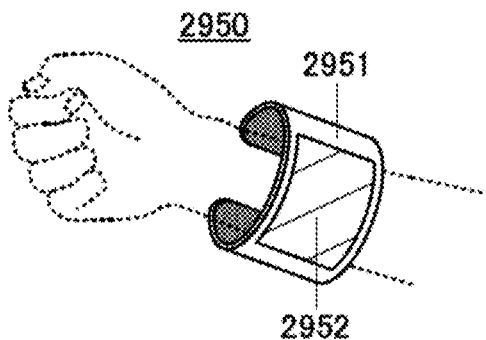

FIG. 15E illustrates an example of a bangle-type information terminal. An information terminal 2950 includes a housing 2951, a display portion 2952, and the like. The information terminal 2950 also includes an antenna, a battery, and the like inside the housing 2951. The display portion 2952 is supported by the housing 2951 having a curved surface. A display panel with a flexible substrate is provided in the display portion 2952, so that the information terminal 2950 can be a user-friendly information terminal that is flexible and lightweight.

Figure 15F:
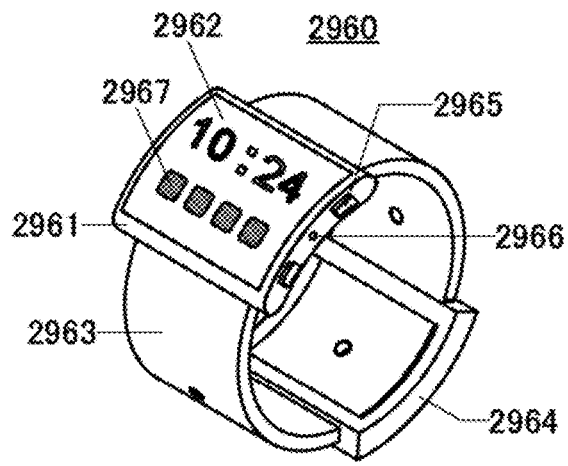

FIG. 15F illustrates an example of a watch-type information terminal. An information terminal 2960 includes a housing 2961, a display portion 2962, a band 2963, a buckle 2964, an operation switch 2965, an input/output terminal 2966, and the like. The information terminal 2960 also includes an antenna, a battery, and the like inside the housing 2961. The information terminal 2960 is capable of executing a variety of applications such as mobile phone calls, e-mailing, text viewing and editing, music reproduction, Internet communication, and computer games.

The electronic component including the data processing device of one embodiment of the present invention can hold, for example, control data or a control program of the above electronic device for a long time. With the use of the data processing device of one embodiment of the present invention, an electronic device with high portability can be provided.

This embodiment can be implemented in appropriate combination with any of the structures described in the other embodiments and the like.

(Supplementary Notes on Description in this Specification and the Like)

The following are notes on the description of the foregoing embodiments and the structures in the embodiments One embodiment of the present invention can be constituted by appropriately combining the structure described in an embodiment with any of the structures described in the other embodiments. In addition, in the case where a plurality of structure examples are described in one embodiment, some of the structure examples can be combined as appropriate.

Note that what is described (or part thereof) in an embodiment can be applied to, combined with, or replaced with another content (or part thereof) in the same embodiment and/or what is described (or part thereof) in another embodiment or other embodiments.

Note that in each embodiment, a content described in the embodiment is a content described with reference to a variety of diagrams or a content described with text disclosed in this specification.

Note that by combining a diagram (or part thereof) described in one embodiment with another part of the diagram, a different diagram (or part thereof) described in the embodiment, and/or a diagram (or part thereof) described in another embodiment or other embodiments, much more diagrams can be formed.

In this specification and the like, components are classified on the basis of the functions, and shown as blocks independent of one another in block diagrams. However, in an actual circuit or the like, it may be difficult to separate components on the basis of the functions, so that one circuit may be associated with a plurality of functions and several circuits may be associated with one function. Therefore, the segmentation of a block in the block diagrams is not limited by any of the components described in the specification, and can be differently determined as appropriate depending on situations.

In the drawings, the size, the layer thickness, or the region has arbitrary magnitude for description convenience. Therefore, the scale is not necessarily limited to that illustrated in the drawings. Note that the drawings are schematically illustrated for clarity, and shapes or values are not limited to those illustrated in the drawings. For example, the following can be included: variation in signal, voltage, or current due to noise or difference in timing.

In this specification and the like, the terms "one of a source and a drain" (or a first electrode or a first terminal) and "the other of the source and the drain" (or a second electrode or a second terminal) are used to describe the connection relation of a transistor. This is because a source and a drain of a transistor are interchangeable depending on the structure, operation conditions, or the like of the transistor. Note that the source or the drain of the transistor can also be referred to as a source (or drain) terminal, a source (or drain) electrode, or the like as appropriate depending on the situation.

In this specification and the like, the term such as "electrode" or "wiring" does not limit the function of the component. For example, an "electrode" is used as part of a "wiring" in some cases, and vice versa. Moreover, the term "electrode" or "wiring" can also mean a combination of a plurality of "electrodes" or "wirings" formed in an integrated manner.

In this specification and the like, "voltage" and "potential" can be replaced with each other. The voltage refers to a potential difference from a reference potential. When the reference potential is a ground potential, for example, "voltage" can be replaced with "potential." The ground potential does not necessarily mean 0 V. Potentials are relative values, and the potential applied to a wiring or the like is changed depending on the reference potential, in some cases.

In this specification and the like, the terms "film" and "layer" can be interchanged with each other depending on the case or circumstances. For example, the term "conductive layer" can be changed into the term "conductive film" in some cases. Moreover, the term "insulating film" can be changed into the term "insulating layer" in some cases.

In this specification and the like, a switch is in a conductive state (on state) or in a non-conductive state (off state) to determine whether current flows therethrough or not. Alternatively, a switch has a function of selecting and changing a current path.

Examples of a switch include an electrical switch and a mechanical switch. That is, any element can be used as a switch as long as it can control current, without limitation to a certain element.

Examples of an electrical switch include a transistor (e.g., a bipolar transistor or a MOS transistor), a diode (e.g., a PN diode, a PIN diode, a Schottky diode, a metal-insulator-metal (MIM) diode, a metal-insulator-semiconductor (MIS) diode, or a diode-connected transistor), and a logic circuit in which such elements are combined.

When a transistor is used as a switch, a "conductive state" of the transistor refers to a state in which a source and a drain of the transistor are electrically short-circuited. Furthermore, a "non-conductive state" of the transistor refers to a state in which the source and the drain of the transistor are electrically disconnected. Note that if the transistor operates just as a switch, there is no particular limitation on the polarity (conductivity type) of the transistor.

An example of a mechanical switch is a switch formed using a MEMS (microelectromechanical system) technology, such as a digital micromirror device (DMD). Such a switch includes an electrode that can be moved mechanically, and operates by controlling conduction and non-conduction in accordance with movement of the electrode.

In this specification and the like, the channel length refers to, for example, the distance between a source and a drain in a region where a semiconductor (or a portion where current flows in a semiconductor when a transistor is on) and a gate overlap with each other or a region where a channel is formed in a top view of the transistor.

In this specification and the like, the channel width refers to, for example, the length of a portion where a source and a drain face each other in a region where a semiconductor (or a portion where current flows in a semiconductor when a transistor is on) and a gate overlap with each other or a region where a channel is formed.

In this specification and the like, the expression "A and B are connected" means the case where A and B are electrically connected to each other as well as the case where A and B are directly connected to each other. Here, the expression "A and B are electrically connected" means the case where electric signals can be transmitted and received between A and B when an object having any electric action exists between A and B.

This application is based on Japanese Patent Application serial no. 2016-255409 filed with Japan Patent Office on Dec. 28, 2016, the entire contents of which are hereby incorporated by reference.

What is claimed is:

1. A data processing device using a neural network comprising:
    an input layer;
    a hidden layer; and
    an output layer,
    wherein the hidden layer comprises:
        a digital-to-analog converter;
        a first neuron circuit;
        a second neuron circuit; and
        a comparator,
    wherein each of the first neuron circuit and the second neuron circuit comprises a first potential holding circuit and a second potential holding circuit,
    wherein the first potential holding circuit and the second potential holding circuit are electrically connected to a bit line,
    wherein the first potential holding circuit is configured to hold a potential of a first analog signal,
    wherein the second potential holding circuit is configured to hold a potential of a second analog signal,
    wherein the first potential holding circuit comprises a first transistor, a second transistor, and a third transistor,
    wherein a gate of the second transistor is electrically connected to one of a source and a drain of the first transistor,
    wherein a gate of the third transistor is electrically connected to a first wiring to which a first digital signal is supplied,
    wherein the second potential holding circuit comprises a fourth transistor, a fifth transistor, and a sixth transistor,
    wherein a gate of the fifth transistor is electrically connected to one of a source and a drain of the fourth transistor,
    wherein a gate of the sixth transistor is electrically connected to a second wiring to which a second digital signal is supplied,
    wherein a third analog signal is output from the first neuron circuit to the second neuron circuit, is input to the comparator to which a reference voltage is applied, and is converted into a third digital signal, and
    wherein the third digital signal is output to the gate of the third transistor included in the second neuron circuit or the gate of the sixth transistor included in the second neuron circuit.

2. The data processing device according to claim 1, wherein the third analog signal is a signal obtained by adding a product of the first analog signal and the first digital signal to a product of the second analog signal and the second digital signal.

3. The data processing device according to claim 1, wherein each of the first transistor and the fourth transistor comprises an oxide semiconductor.

4. The data processing device according to claim 1, wherein each of the second transistor, the third transistor, the fifth transistor, and the sixth transistor comprises silicon.

5. The data processing device according to claim 1, further comprising a third neuron circuit in the hidden layer.

6. An electronic component comprising:
    the data processing device according to claim 1, and
    a lead electrically connected to the data processing device.

7. An electronic device comprising:
    the electronic component according to claim 6,
    a printed circuit board where the electronic component is mounted, and
    a housing incorporating the printed circuit board.

8. A data processing device using a neural network comprising:
    an input layer;
    a hidden layer; and
    an output layer,
    wherein the hidden layer comprises:
        a digital-to-analog converter;
        a first neuron circuit; and
        a second neuron circuit,
    wherein each of the first neuron circuit and the second neuron circuit comprises a first potential holding circuit and a second potential holding circuit,
    wherein the first potential holding circuit and the second potential holding circuit are electrically connected to a bit line, wherein the first potential holding circuit is configured to hold a potential of a first analog signal, wherein the second potential holding circuit is configured to hold a potential of a second analog signal, wherein the first potential holding circuit comprises a first transistor, a second transistor, and a third transistor, wherein a gate of the second transistor is electrically connected to one of a source and a drain of the first transistor, wherein a gate of the third transistor is electrically connected to a first wiring to which a first digital signal is supplied, wherein the second potential holding circuit comprises a fourth transistor, a fifth transistor, and a sixth transistor, wherein a gate of the fifth transistor is electrically connected to one of a source and a drain of the fourth transistor, wherein a gate of the sixth transistor is electrically connected to a second wiring to which a second digital signal is supplied, and wherein a third analog signal is output from the first neuron circuit to the second neuron circuit.

9. The data processing device according to claim 8, wherein the third analog signal is a signal obtained by adding a product of the first analog signal and the first digital signal to a product of the second analog signal and the second digital signal.

10. The data processing device according to claim 8, wherein each of the first transistor and the fourth transistor comprises an oxide semiconductor.

11. The data processing device according to claim 8, wherein each of the second transistor, the third transistor, the fifth transistor, and the sixth transistor comprises silicon.

12. An electronic component comprising:

the data processing device according to claim 8, and a lead electrically connected to the data processing device.

13. An electronic device comprising:

the electronic component according to claim 12, a printed circuit board where the electronic component is mounted, and a housing incorporating the printed circuit board.

* * * * *